United States Patent
Kim et al.

(10) Patent No.: US 10,740,033 B2
(45) Date of Patent: Aug. 11, 2020

(54) MEMORY DEVICE SAMPLING DATA USING CONTROL SIGNAL TRANSMITTED THROUGH TSV

(71) Applicant: Samsung Electronics Co., Ltd., Suwon-si (KR)

(72) Inventors: So-young Kim, Hwaseong-si (KR); Reum Oh, Hwaseong-si (KR); Haesuk Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/197,877

(22) Filed: Nov. 21, 2018

(65) Prior Publication Data
US 2019/0303042 A1    Oct. 3, 2019

(30) Foreign Application Priority Data

Mar. 30, 2018    (KR) ........................ 10-2018-0037151

(51) Int. Cl.
*G06F 3/06* (2006.01)
*H01L 25/18* (2006.01)
(Continued)

(52) U.S. Cl.
CPC ............ *G06F 3/0659* (2013.01); *G06F 3/061* (2013.01); *G06F 3/0673* (2013.01);
(Continued)

(58) Field of Classification Search
CPC ...... G06F 3/0659; G06F 3/0673; G06F 3/061; G11C 11/4076; G11C 11/4087; G11C 11/4093
(Continued)

(56) References Cited

U.S. PATENT DOCUMENTS 6,889,334 B1    5/2005   Magro et al.
7,454,303 B2   11/2008   Magee et al.
(Continued)

FOREIGN PATENT DOCUMENTS

JP    2001-319470 A    11/2001
JP    2013-172395 A     9/2013
KR    10-1462604 B1    12/2009

OTHER PUBLICATIONS

Lim et al. / A 247 uW 800 Mb/s/pin DLL-Based Data Self-Aligner for TSV Interface/ IEEE Journal of Solid-State Circuits, vol. 48, No. 3, Mar. 2013 / 13 pages.

*Primary Examiner* — Hua J Song
(74) *Attorney, Agent, or Firm* — Muir Patent Law, PLLC

(57) ABSTRACT

A memory die of a memory device includes a first first-in first-out (FIFO) circuit that samples data output from a memory cell array and outputs the data to a buffer die through a first through silicon via, based on a control signal transmitted from the buffer die. A buffer die of the memory device includes a second FIFO circuit that samples the data output from the first FIFO unit based on the control signal transmitted from the memory die through a second through silicon via, a calibration circuit that generates a delay code, based on a latency of a path from the buffer die to the first FIFO circuit and from the first FIFO circuit to the second FIFO circuit, and a delay control circuit that generates the control signal transmitted to the memory die through a third through silicon via, based on the read command and the delay code.

20 Claims, 15 Drawing Sheets

(51) Int. Cl.
  *G11C 11/4093* (2006.01)
  *G11C 11/4076* (2006.01)
  *H01L 23/48* (2006.01)
  *H01L 25/065* (2006.01)
  *G11C 11/408* (2006.01)

(52) U.S. Cl.
  CPC ...... *G11C 11/4076* (2013.01); *G11C 11/4087* (2013.01); *G11C 11/4093* (2013.01); *H01L 23/481* (2013.01); *H01L 25/0657* (2013.01); *H01L 25/18* (2013.01); *H01L 2225/06513* (2013.01); *H01L 2225/06541* (2013.01); *H01L 2225/06565* (2013.01)

(58) Field of Classification Search
  USPC ........................................................ 711/154
  See application file for complete search history.

(56) References Cited

U.S. PATENT DOCUMENTS

| | | |
|---|---|---|
| 7,913,000 B2 | 3/2011 | Chung |
| 8,054,663 B2 | 11/2011 | Chung |
| 8,131,893 B2 | 3/2012 | Sasaki et al. |
| 8,223,524 B2 | 7/2012 | Chung |
| 8,261,004 B2 | 9/2012 | Chung |
| 8,904,060 B2 | 12/2014 | Lee et al. |
| 8,984,189 B2 | 3/2015 | Casper et al. |
| 10,082,823 B1 * | 9/2018 | Chang .................... G11C 7/106 |
| 2010/0205386 A1 * | 8/2010 | Yamashita .......... G06F 13/1689 711/154 |
| 2011/0187429 A1 | 8/2011 | Byeon et al. |

* cited by examiner

MEMORY DEVICE SAMPLING DATA USING CONTROL SIGNAL TRANSMITTED THROUGH TSV

CROSS-REFERENCE TO RELATED APPLICATIONS

This application claims priority under 35 U.S.C. § 119 to Korean Patent Application No. 10-2018-0037151 filed on Mar. 30, 2018, in the Korean Intellectual Property Office, the disclosure of which is incorporated by reference herein in its entirety.

BACKGROUND

The present disclosure relates to a semiconductor device, and more particularly, relates to a memory device sampling data using a control signal transmitted through a through silicon via (TSV).

A plurality of memory dies may be stacked to increase the degree of integration of a memory device. A memory device with three-dimensional structure may store and process a large amount of data. For forming the three-dimensional structure, various packaging technologies may be applied to semiconductor dies. In particular, since a through silicon via (TSV) is appropriate for miniaturization and high speed of the memory device, the through silicon via may be used to stack semiconductor dies.

Time points at which signals are output from stacked memory dies may vary due to process, voltage, and temperature variations of the memory dies. The difference between the output time points may make it difficult for the memory device to operate at a high speed. Also, in the case where a circuit of compensating for the output time points is positioned on a buffer die where memory dies are stacked, the area of the buffer die may increase.

SUMMARY

Embodiments of the present disclosure provide a memory device which samples data by using a control signal transmitted through a through silicon via.

According to an exemplary embodiment, a memory device may include a buffer die receiving a read command, and a memory receiving the read command transmitted from the buffer die. The memory die may include a memory cell array that outputs data in response to the read command, and a first first-in first-out (FIFO) circuit that samples the data output from the memory cell array, and outputs the data to the buffer die through a first through silicon via, based on a control signal transmitted from the buffer die. The buffer die may include a second FIFO circuit that samples the data output from the first FIFO circuit through the first through silicon via, based on the control signal transmitted from the memory die through a second through silicon via, a calibration unit that generates a delay code, based on a latency of a path from the buffer die to the first FIFO circuit and from the first FIFO circuit to the second FIFO circuit, and a delay control circuit that generates the control signal transmitted to the memory die through a third through silicon via, based on the read command and the delay code.

According to an exemplary embodiment, a memory device may include a buffer die receiving a read command, and a memory die receiving the read command transmitted from the buffer die. The memory die may include a memory cell array that outputs data in response to the read command, a delay control circuit that generates a control signal, based on the read command and a delay code output from the buffer die, and a first FIFO circuit that samples the data output from the memory cell array and outputs the data to the buffer die through a first through silicon via, based on the control signal. The buffer die may include a second FIFO circuit that samples the data output from the first FIFO circuit through the first through silicon via, based on the control signal transmitted from the memory die through a second through silicon via, and a calibration unit that generates the delay code, based on a latency of a path from the buffer die to the first FIFO circuit and from the first FIFO circuit to the second FIFO circuit.

According to an exemplary embodiment, a memory device may include a buffer die receiving a read command, and a plurality of memory dies that receive the read command transmitted from the buffer die. Each of the plurality of memory dies may include a memory cell array that outputs data in response to the read command, and a first FIFO circuit that samples the data output from the memory cell array and outputs the data to the buffer die through at least one first through silicon via, based on the control signal. The buffer die may include a second FIFO circuit that samples the data output from the first FIFO circuit through the at least one first through silicon via, based on the control signal transmitted from each of the plurality of memory dies through at least one second through silicon via, and a calibration unit that generates a delay code indicating a delay of the control signal, based on a latency of a path from the buffer die to the first FIFO circuit and from the first FIFO circuit to the second FIFO circuit.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Below, embodiments of the inventive concept may be described in detail and clearly to such an extent that an ordinary one in the art easily implements the inventive concept.

Figure 1:
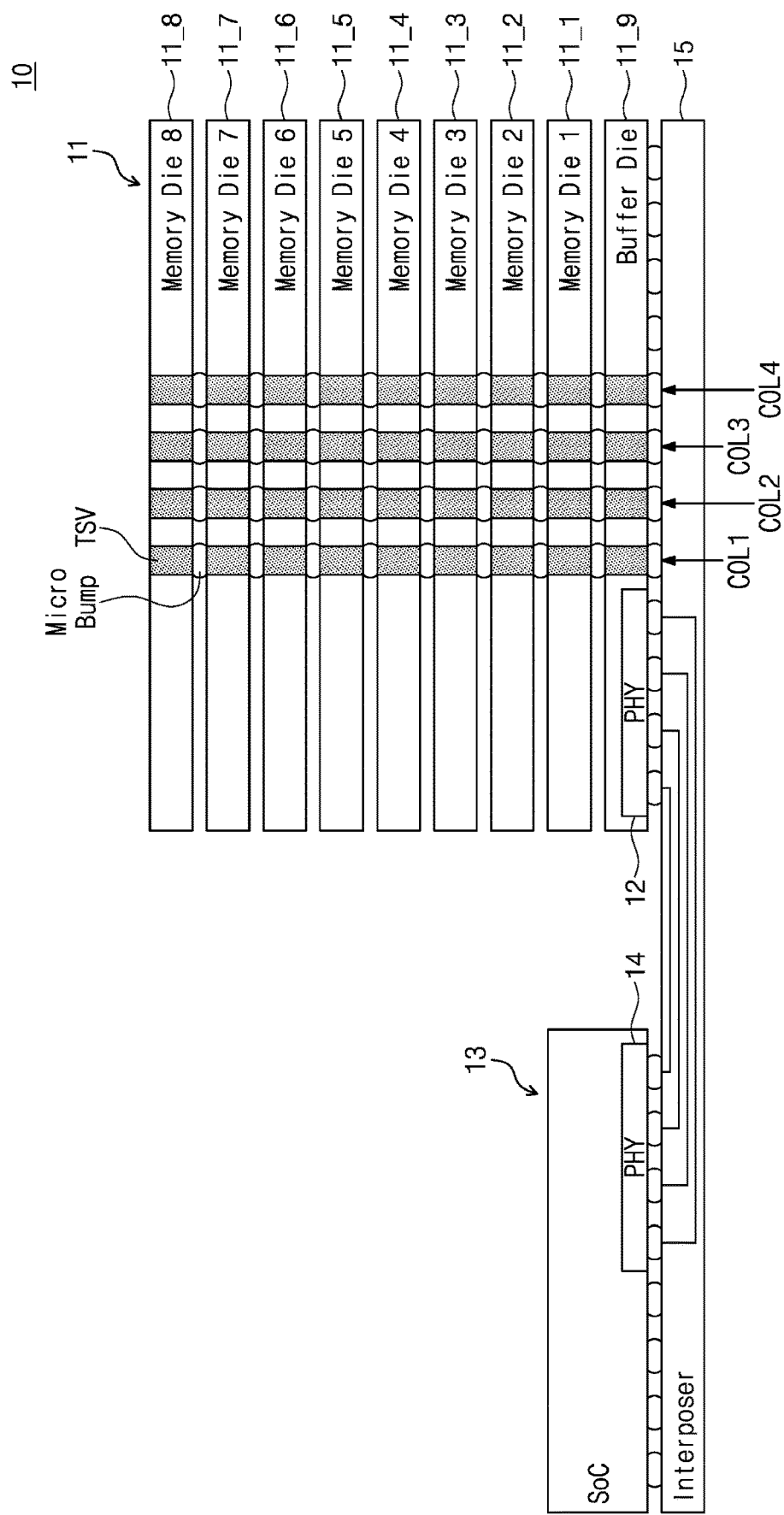
FIG. 1 is a diagram illustrating an electronic device according to an embodiment of the inventive concept.

FIG. 1 is a diagram illustrating an electronic device according to an embodiment of the inventive concept. An electronic device 10 may include a memory device 11, a system on chip (SoC) 13, and an interposer 15.

As used herein, a memory device may refer to various items such as a semiconductor memory device, one or more logic devices or memory cells formed in or on a semiconductor substrate, a semiconductor chip, a memory chip, a memory die, a logic chip, a package, a package including one or more memory chips and optionally one or more logic chips, or combinations thereof. A memory device such as a semiconductor chip, a memory chip, or a logic chip may be formed from a wafer. A memory device may comprise a package which may include one or more chips stacked on a package substrate, or a package-on-package device including a plurality of packages.

An electronic device, as used herein, may refer to one of these devices and may also include products that include these devices, such as a memory card, a memory module, a hard drive including additional components, a mobile phone, laptop, tablet, desktop, camera, server, computing system, or other consumer electronic device, etc.

The memory device 11 may include first to eighth memory dies 11_1 to 11_8 and a buffer die 11_9. The first to eighth memory dies 11_1 to 11_8 may be sequentially stacked on the buffer die 11_9 in a perpendicular direction. The first to eighth memory dies 11_1 to 11_8 and the buffer die 11_9 may be electrically connected to each other through micro bumps and through silicon vias TSV arranged in a matrix form. The TSV may be referred to as a through substrate via. Locations of the through silicon vias and the micro bumps are not limited to illustration of FIG. 1. For example, though a plurality of through silicon vias and micro bumps of the first to eighth memory dies 11_1 to 11_8 and a buffer die 11_9 disposed in a first column COL1 are connected to each other, the through silicon vias of the first to eighth memory dies 11_1 to 11_8 disposed in the first column COL1 may be connected to a through silicon via of the buffer die 11_9 disposed in a second column COL2, a third column COL3, or a fourth column COL4.

The first to eighth memory dies 11_1 to 11_8 may be identically manufactured. The first to eighth memory dies 11_1 to 11_8 may constitute a stack. The memory device 11 is illustrated in FIG. 1 as including eight memory dies 11_1 to 11_8. However, the inventive concept is not limited thereto. Here, a memory die may be referred to as a "core die", a "slave die", etc., and a die may be referred to as a "chip".

The buffer die 11_9 may communicate with a device (e.g., the SoC 13) positioned at the outside of the memory device 11. The buffer die 11_9 may transmit an address and data provided from the SoC 13 to the first to eighth memory dies 11_1 to 11_8 and may receive data from the first to eighth memory dies 11_1 to 11_8. The buffer die 11_9 may provide an interface between the first to eighth memory dies 11_1 to 11_8 and the buffer die 11_9. The buffer die 11_9 may include a physical layer (PHY) 12 electrically connected with the SoC 13. Here, the buffer die 11_9 may be referred to as an "interface die", a "master die", a logic die", etc.

In an embodiment, the memory device 11 may be a general-purpose dynamic random access memory (DRAM) device such as a double data rate (DDR) synchronous DRAM (SDRAM), a DDR2 SDRAM device, a DDR3 SDRAM device, a DDR4 SDRAM device, or a DDR5 SDRAM device. The memory device 11 may be a mobile DRAM device such as a low power double data rate (LPDDR) SDRAM device, an LPDDR2 SDRAM device, an LPDDR3 SDRAM device, an LPDDR4 SDRAM device, an LPDDR4X SDRAM device, or an LPDDR5 SDRAM device. The memory device 11 may be a graphics DRAM device such as a graphics double data rate (GDDR) synchronous graphics random access memory (SGRAM) device, a GDDR2 SGRAM device, a GDDR3 SGRAM device, a GDDR4 SGRAM device, a GDDR5 SGRAM device, or a GDDR6 SGRAM device. The memory device 11 may be a memory device, which provides a large capacity and a high bandwidth, such as wide I/O, a high bandwidth memory (HBM), a HBM2, a HBM3, a hybrid memory cube (HMC).

The SoC 13 may include a processor, which may perform various operations, for applications which the electronic device 10 supports. For example, the SoC 13 may include at least one of a central processing unit (CPU), an image signal processing unit (ISP), a digital signal processing unit (DSP), a graphics processing unit (GPU), a vision processing unit (VPU), and a neural processing unit (NPU). The SoC 13 may include a physical layer (PHY) 14 electrically connected with the buffer die 11_9. The SoC 13 may store data necessary for an operation to the memory device 11 or may read data necessary for an operation from the memory device 11.

The interposer 15 may connect the memory device 11 and the SoC 13. In particular, the interposer 15 may provide physical paths which are interposed between the memory device 11 and the SoC 13 and are formed of conductive materials for an electrical connection. In some examples, the interposer 15 may be a silicon interposer. In some examples, the interposer 15 may be a printed circuit board (PCB) or a package substrate.

Figure 2:
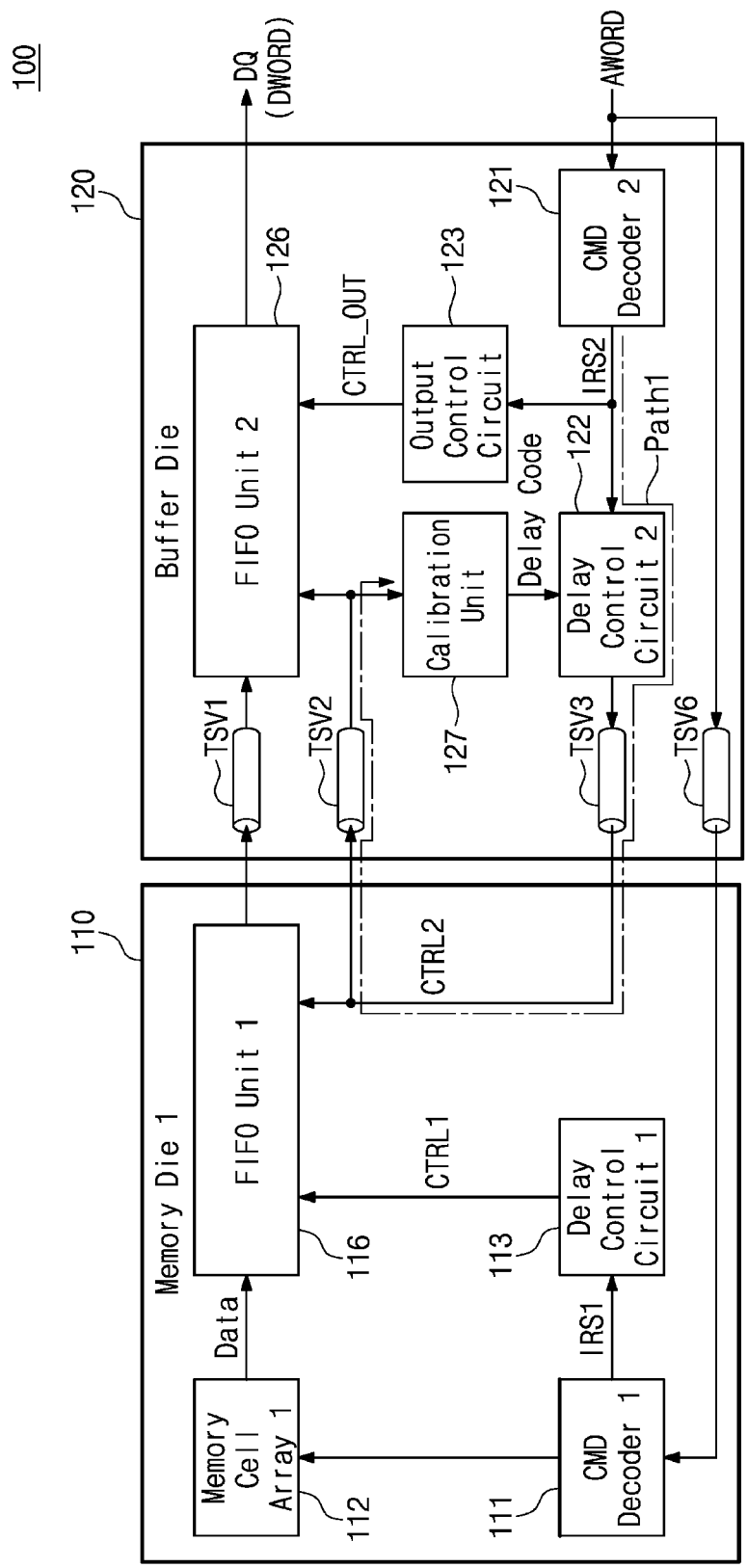
FIG. 2 is a block diagram illustrating a buffer die and a first memory die of a memory device of FIG. 1 according to example embodiments.

FIG. 2 is a block diagram illustrating a buffer die and a first memory die of the memory device of FIG. 1 according to example embodiments. FIG. 2 will be described with reference to FIG. 1. A first memory die 110 may be the first memory die 11_1 of FIG. 1. A buffer die 120 may be the buffer die 11_9 of FIG. 1. A memory device 100 may include the first memory die 110 and the buffer die 120. The memory device 100 may be the memory device 11 of FIG. 1. In some examples, the first memory die 110 may be any one of the second to eighth memory dies 11_2 to 11_8 of FIG. 1. A first through silicon via TSV1, a second through silicon via TSV2, a third through silicon via TSV3, and a sixth through silicon via TSV6, which are used for a communication between the first memory die 110 and the buffer die 120 may pass through the buffer die 120. As well as through silicon vias illustrated in FIG. 2, other through silicon vias may be further formed in the buffer die 120.

In example embodiments, each of the first through silicon via, second through silicon via, third through silicon via, and sixth through silicon via may penetrate the buffer die 120 or the first memory die 110, and the first through silicon via, second through silicon via, third through silicon via, and sixth through silicon via may be horizontally spaced apart from each other.

The first memory die 110 may include a first command decoder 111, a first memory cell array 112, a first delay control circuit 113, and a first first-in first-out (FIFO) unit 116. As used herein, a "unit" may refer to a "circuit".

The first command decoder 111 may receive addresses (or, command addresses) from the buffer die 120 through the sixth through silicon via. Here, the address may constitute AWORD, and may include a row command, a row address, a column command, a column address, etc. For brevity of drawing, the sixth through silicon via is illustrated as including one through silicon via, but the number of the sixth through silicon via may be one or more. In example embodiments, the buffer die 120 may further include a command buffer (not shown). In some examples, the command buffer may delay the AWORD signal. Thus, the first command decoder 111 may receive the delayed signal of the AWORD signal from the command buffer of the buffer die 120.

The first command decoder 111 may decode various commands, which are transmitted from the buffer die 120, such as an activation command, a write command, a refresh command, a read command, a precharge command, etc. The first command decoder 111 may decode a command and may control circuits (the first memory cell array 112, the first delay control circuit 113, etc.) constituting the first memory die 110.

The first memory cell array 112 may include memory cells (not illustrated) at intersections of word lines (i.e., rows) and bit lines (i.e., columns). For example, a memory cell may be a DRAM cell, a static random access memory (SRAM) cell, a NAND flash memory cell, a NOR flash memory cell, a resistive random access memory (RRAM) cell, a ferroelectric random access memory (FRAM) cell, a phase change random access memory (PRAM) cell, a thyristor random access memory (TRAM) cell, a magnetic random access memory (MRAM) cell, etc.

The first memory cell array 112 may be divided into a plurality of banks depending on the number of banks, a capacity, etc. which a memory device 100 supports. The number of the first memory cell array 112 is not limited to this disclosure.

The first memory cell array 112 may store data in response to a write command. The first memory cell array 112 may output the stored data in response to a read command. A row decoder and a column decoder, which control the first memory cell array 112 under control of the first command decoder 111, are not illustrated.

The first delay control circuit 113 may generate a first control signal CTRL1 for sampling data output from the first memory cell array 112 in response to the read command. For example, the first delay control circuit 113 may generate the first control signal CTRL1, based on a first internal read signal IRS1 of the first command decoder 111. The first delay control circuit 113 may generate the first control signal CTRL1 after a time needed for data to be output from the first memory cell array 112 depending on the read command.

In an embodiment, the first command decoder 111 may generate the first internal read signal IRS1 after the time needed for the data to be output from the first memory cell array 112 depending on the read command. In another embodiment, the first delay control circuit 113 receives the first internal read signal IRS1, and then the first delay control circuit 113 may generate the first control signal CTRL1 after the time needed for the data to be output from the first memory cell array 112 depending on the read command. An interval between the read command and the first control signal CTRL1 may be set to a multiple of a period of a clock which the memory device 100 receives. Alternatively, the interval between the read command and the first control signal CTRL1 may be set to an absolute value regardless of the clock which the memory device 100 receives.

The first FIFO unit 116 may sample data output from the first memory cell array 112, based on the first control signal CTRL1. The first FIFO unit 116 may output the sampled data to the buffer die 120 through the first through silicon via, based on a second control signal CTRL2. In detail, the data may be composed of a plurality of bits. The first FIFO unit 116 may sequentially output sampled bits from a first sampled bit to a lastly sampled bit. A depth of the first FIFO unit 116 may indicate the number of bits which the first FIFO unit 116 may sample.

In an embodiment, the depth of the first FIFO unit 116 may be determined depending on a characteristic (e.g., a process, a voltage and a temperature (PVT) variation of the first memory die 110) of the first memory die 110 and a characteristic of the buffer die 120. In detail, the depth of the first FIFO unit 116 may be determined depending on the following condition: a time needed for data to be output from the first memory cell array 112 depending on a read command, a time needed from data to be output from the buffer die 120, a read latency of the memory device 100, etc.

Each of memory dies (e.g., the first to eighth memory dies 11_1 to 11_8 of FIG. 1) may include the first FIFO unit 116, and the depths of the first FIFO units 116 in the memory dies may be identical to or different from each other. For example, each of the memory dies may include the first FIFO unit 116 so that output time points (or read time points) of data output from the memory dies are synchronized with each other regardless of the PVT variation of the memory dies.

The buffer die 120 may include a second command decoder 121, a second delay control circuit 122, an output control circuit 123, a second FIFO unit 126, and a calibration unit 127.

As in the first command decoder 111, the second command decoder 121 may decode a command transmitted from the outside (e.g., the SoC 13 of FIG. 1) of the memory device 100. The second command decoder 121 may control circuits (the second delay control circuit 122, the output control circuit 123, the calibration unit 127, etc.) constituting the buffer die 120. The second command decoder 121 may provide a second internal read signal IRS2 to the second delay control circuit 122 and the output control circuit 123 in response to the read command.

The second delay control circuit 122 may generate the second control signal CTRL2, based on the read command input to the memory device 100 and a delay code provided from the calibration unit 127. The second control signal CTRL2 may be transmitted to the first memory die 110 through the third through silicon via. The second delay control circuit 122 may generate the second control signal CTRL2 in consideration of an output timing of the first FIFO unit 116 and a sampling timing of the second FIFO unit 126. Alternatively, the second command decoder 121 may generate the second internal read signal IRS2 in consideration of the output timing of the first FIFO unit 116 and the sampling timing of the second FIFO unit 126.

The output control circuit 123 may generate an output control signal CTRL_OUT, based on the read command input to the memory device 100. Here, the output control signal CTRL_OUT may correspond to a data strobe signal DQS used to sample data output from the memory device 100. The output control circuit 123 may generate the output control signal CTRL_OUT in consideration of a read latency in advance determined, and a path between the second FIFO unit 126 and a DQ input/output pad (not illustrated). For example, the read latency may be in advance defined in compliance with a protocol between a memory device and a SoC, a JEDEC (Joint Electron Device Engineering Council) standard, etc.

The second FIFO unit 126 may sample data transmitted through the first through silicon via from the first FIFO unit 116, based on the second control signal CTRL2 transmitted from the first memory die 110. Due to a location difference of the first FIFO unit 116 and the second FIFO unit 126, a physical length of a path through which the second control signal CTRL2 is transmitted, etc., the second FIFO unit 126 may receive the second control signal CTRL2 to be later than the first FIFO unit 116.

The second FIFO unit 126 may output the sampled data to the outside of the buffer die 120 (e.g., the SoC 13). As in the first FIFO unit 116, the second FIFO unit 126 may output sampled bits from a first sampled bit to a lastly sampled bit. The depth of the second FIFO unit 126 may indicate the number of bits which the second FIFO unit 126 may sample.

In an embodiment, the first memory die 110 may include the first FIFO unit 116, and the buffer die 120 may include the second FIFO unit 126. For example, the depth, the sampling time point, and the output time point of the first FIFO unit 116 and the depth, the sampling time point, and the output time point of the second FIFO unit 126 may be calibrated or adjusted to compensate for the PVT variation (or a PVT difference) between the first memory die 110 and the buffer die 120.

In an embodiment, the second FIFO unit 126 may not immediately receive the second control signal CTRL2 generated by the buffer die 120. The second FIFO unit 126 may receive data through the first through silicon via from the first memory die 110, and may similarly receive the second control signal CTRL2 through the second through silicon via from the first memory die 110. For example, the second FIFO unit 126 may receive the second control signal CTRL2 passing through the second through silicon via.

In the case where an operating voltage of the memory device 100 decreases and an operating frequency increases, a capture margin (or a sampling margin) in which the second FIFO unit 126 samples data may decrease. Also, the capture margin may vary due to the PVT variation between the first memory die 110 and the buffer die 120. Accordingly, to improve and uniformly maintain the capture margin, the memory device 100 may include a path through which data are transmitted from the first FIFO unit 116 to the second FIFO unit 126 and a path through which the second control signal CTRL2 is transmitted from the first FIFO unit 116 to the second FIFO unit 126. The paths may be implemented identically to each other, and loadings of the paths may be identical to each other.

Bits of data output from the second FIFO unit 126 may correspond to any one DQ (i.e., a data input/output signal). The number of DQs of the memory device 100 may be determined in compliance with the JEDEC standard. For example, the buffer die 120 may include the second FIFO units 126 as much as the number of DQs. The DQs may constitute "DWORD". Also, the first memory die 110 may include a plurality of the first FIFO units 116, based on the number of DQs.

Circuits which drive all DQs supported by the memory device 100 may be positioned at the buffer die 120. Circuits for transmitting data to the circuits driving the DQs of the buffer die 120 may be distributed into the memory dies 11_1 to 11_8 of FIG. 1. For example, the number of the second FIFO units 126 positioned at the buffer die 120 may be more than the number of the first FIFO units 116 positioned at the first memory die 110. For example, the number of the first FIFO units 116 may be not more than half the number of the second FIFO units 126. A CCD (CAS to CAS Delay or Read to Read Delay) of the buffer die 120 may be greater than a CCD of the first memory die 110. The area of a physical layer (refer to PHY 12 of FIG. 1) in the buffer die 120 may be limited by the area of a physical layer (refer to PHY 14 of FIG. 1) in the SoC 13 of FIG. 1. Accordingly, a limitation on the area of the buffer die 120, in which the second FIFO units 126 are positioned, may be worse than a limitation on the area of the first memory die 110, in which the first FIFO units 116 are positioned.

In an embodiment, the depth of the second FIFO unit 126 may be smaller than the depth of the first FIFO unit 116. As described above, since the depth indicates the number of bits to be sampled, the area of the second FIFO unit 126 may decrease as the depth becomes smaller. For example, the depth of the second FIFO unit 126 may be not more than 2, and a time difference of the second control signal CTRL2 and the output control signal CTRL_OUT which the second FIFO unit 126 receives may be within two times the period of the clock.

The calibration unit 127 may calculate a latency, which the buffer die 120 needs, of the read latency and may generate the delay code. For example, the read latency may be divided into an interval from a time point when the read command is input to a time point when data are output from the first memory cell array 112, an interval from a time point when the data are output from the first memory cell array 112 to a time point when data are output from the first memory die 110, and an interval from a time point when the data are output from the first memory die 110 to a time point when data are output from the buffer die 120.

The calibration unit 127 may count a latency of a first path Path1 (illustrated by an alternate long and short dash line), which includes a path from the buffer die 120 to the first FIFO unit 116 and a path from the first FIFO unit 116 to the second FIFO unit 126, and may generate the delay code. Based on the delay code generated by the calibration unit 127, the second delay control circuit 122 may delay the second internal read signal IRS2 and may generate the second control signal CTRL2, so that the area of the second FIFO unit 126 is minimized and the depth of the second FIFO unit 126 is not more than 2. For example, the first path may indicate a path in which any signal generated by the second command decoder 121 passes through the second delay control circuit 122, the third through silicon via, the first memory die 110, and the second through silicon via. Only the first path between the first memory die 110 and the buffer die 120 is illustrated in FIG. 2, but the memory device 100 may further include any other path between any one of the remaining memory dies and the buffer die 120. The calibration unit 127 may generate the delay code in further consideration of a latency of the other path.

Figure 3:
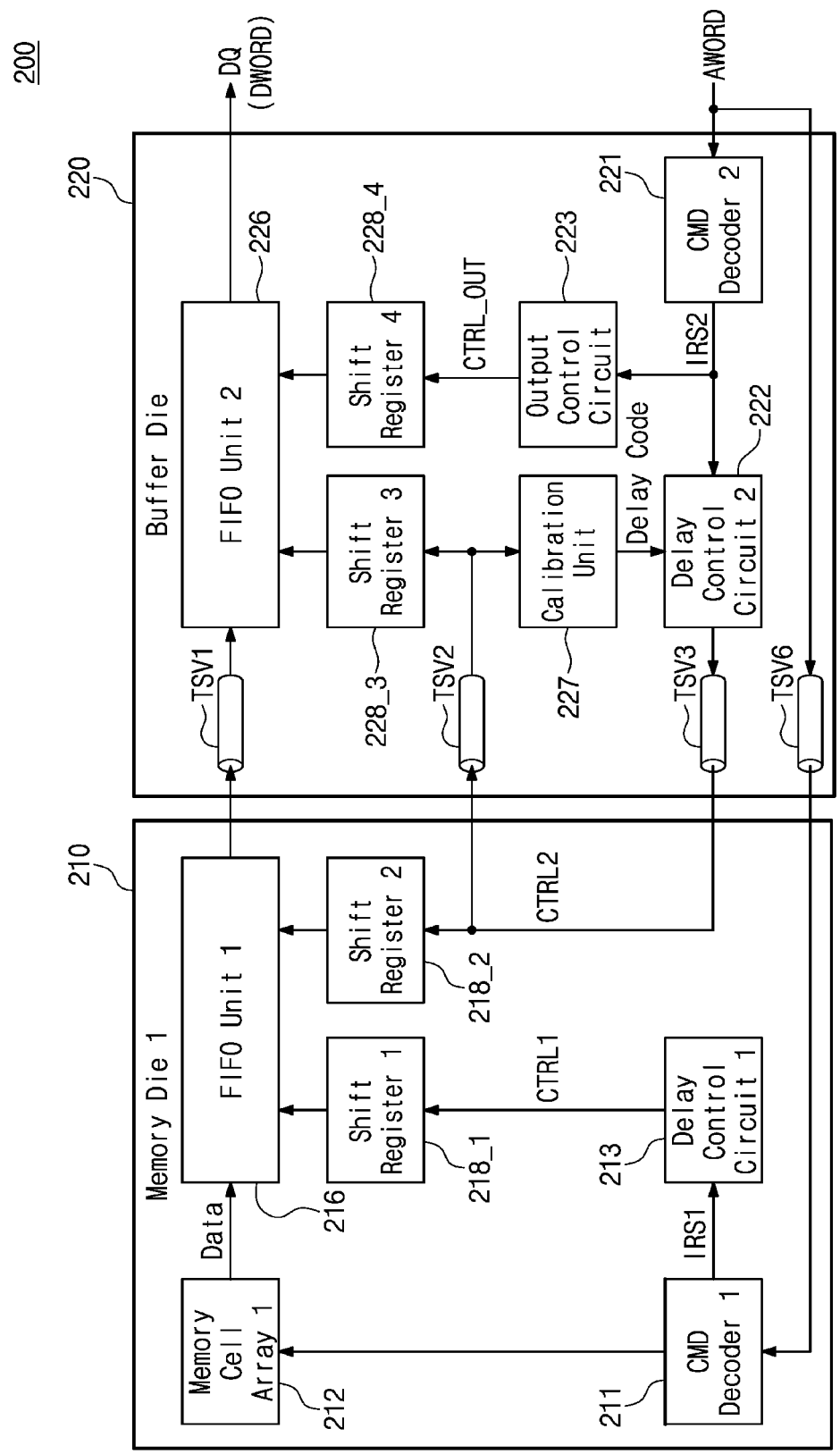
FIG. 3 is a block diagram illustrating a buffer die and a memory die of a memory device of FIG. 1 according to example embodiments.

FIG. 3 is a block diagram illustrating a buffer die and a memory die of the memory device of FIG. 1 according to example embodiments. FIG. 3 will be described with reference to FIGS. 1 and 2. A memory device 200 may include a first memory die 210 and a buffer die 220. The memory device 200 may be the memory device 11 of FIG. 1, the first memory die 210 may be the first memory die 11_1 of FIG. 1, and the buffer die 220 may be the buffer die 11_9 of FIG. 1. The first memory die 210 may include a first command decoder 211, a first memory cell array 212, a first delay control circuit 213, and a first FIFO unit 216. Operations of components in the first memory die 210 may be identical to operations of the components in the first memory die 110 of FIG. 2, which have similar reference numerals.

The buffer die 220 may include a second command decoder 221, a second delay control circuit 222, an output control circuit 223, a second FIFO unit 226, and a calibration unit 227. Operations of components in the buffer die 220 may be identical to operations of the components in the buffer die 120 of FIG. 2, which have similar reference numerals.

The first memory die 210 may further include first and second shift registers 218_1 and 218_2. The first and second shift registers 218_1 and 218_2 may respectively shift the first and second control signals CTRL1 and CTRL2 and may generate delayed signals. The first FIFO unit 216 may sequentially sample bits of data output from the first memory cell array 212 by using delayed signals which the first control signal CTRL1 is shifted. The first FIFO unit 216 may sequentially output the sampled bits of the data by using delayed signals which the second control signal CTRL2 is shifted.

The buffer die 220 may further include third and fourth shift registers 228_3 and 228_4. The third and fourth shift registers 228_3 and 228_4 may shift the second control signal CTRL2, which is transmitted through the second through silicon via, and the output control signal CTRL_OUT, respectively. The third and fourth shift registers 228_3 and 228_4 may generate delayed signals, respectively. The second FIFO unit 226 may sequentially sample bits of data output from the first FIFO unit 216 by using delayed signals which the second control signal CTRL2 transmitted through the second through silicon via is shifted. The second FIFO unit 226 may sequentially output the sampled bits of the data by using delayed signals which the output control signal CTRL_OUT is shifted.

In example embodiments, the second shift register 218_2 may be disposed between the second delay control circuit 222 and the third through silicon via. In this case, the third shift register 228_3 may be omitted. For example, the second control signal CTRL2 transmitted through the second through silicon via directly transmits to the second FIFO unit 226.

Figure 4:
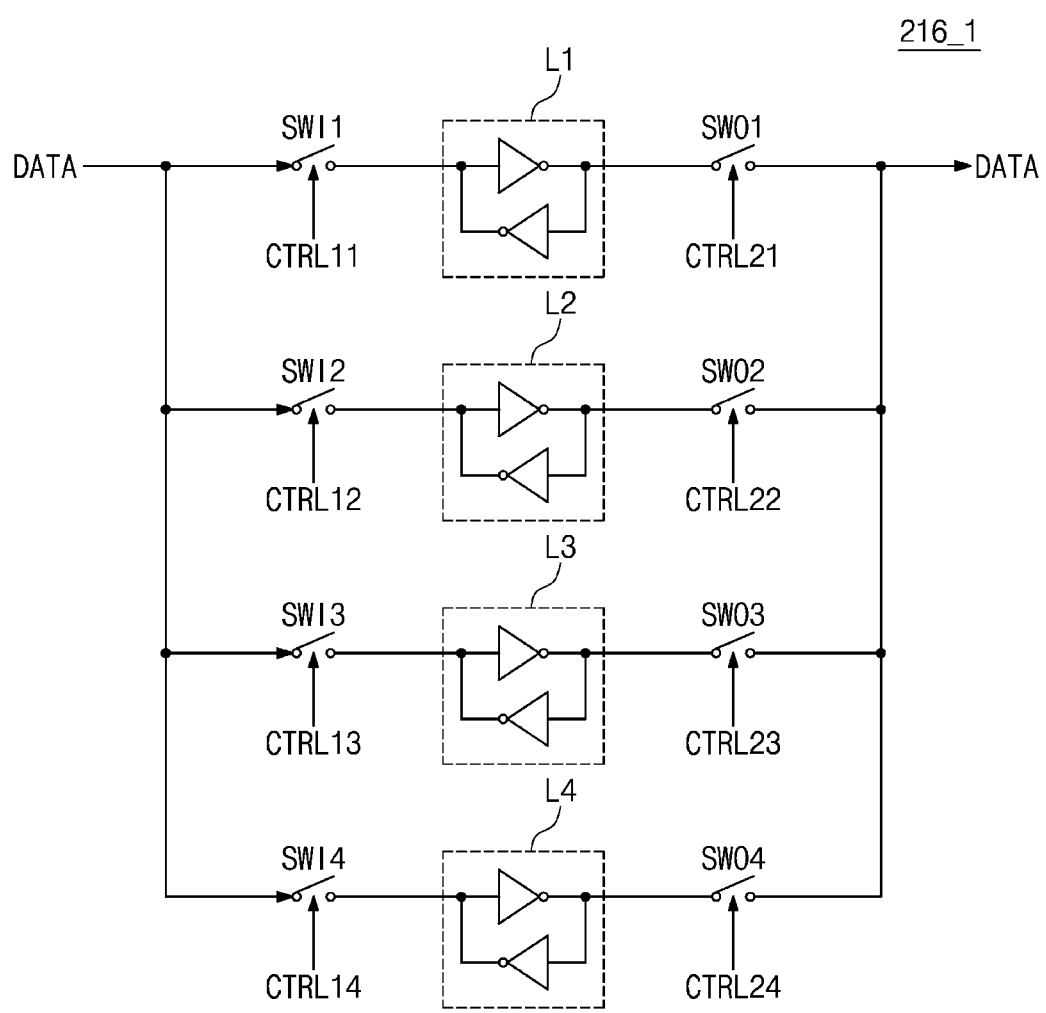
FIG. 4 is a block diagram illustrating a first FIFO unit of FIG. 2 or 3.

FIG. 4 is a block diagram illustrating a first FIFO unit of FIG. 2 or 3. FIG. 4 will be described with reference to FIG. 3. The first FIFO unit 216 may include first to fourth input switches SWI1 to SWI4, first to fourth latches L1 to L4, and first to fourth output switches SWO1 to SWO4. In an embodiment, an example is illustrated in FIG. 4 as the depth of the first FIFO unit 216 is "4". The number of input switches, the number of latches, and the number of output switches may be determined depending on the depth of the first FIFO unit 216.

The first to fourth input switches SWI1 to SWI4 may be turned on sequentially depending on first to fourth input control signals CTRL11 to CTRL14. The first to fourth input control signals CTRL11 to CTRL14 are signals generated by shifting the first control signal CTRL1 at the first shift register 218_1. The first to fourth latches L1 to L4 may sequentially store data bits. The first to fourth output switches SWO1 to SWO4 may be turned on sequentially depending on first to fourth output control signals CTRL21 to CTRL24. The first to fourth output control signals CTRL21 to CTRL24 are signals generated by shifting the second control signal CTRL2 transmitted through the second through silicon via at the second shift register 218_2. The first to fourth latches L1 to L4 may sequentially output stored or sampled data bits. In an embodiment, the second FIFO unit 226 may be implemented to be similar to the first FIFO unit 216. However, as described above, the depth of the second FIFO unit 226 may be smaller than the depth of the first FIFO unit 216.

Figure 5:
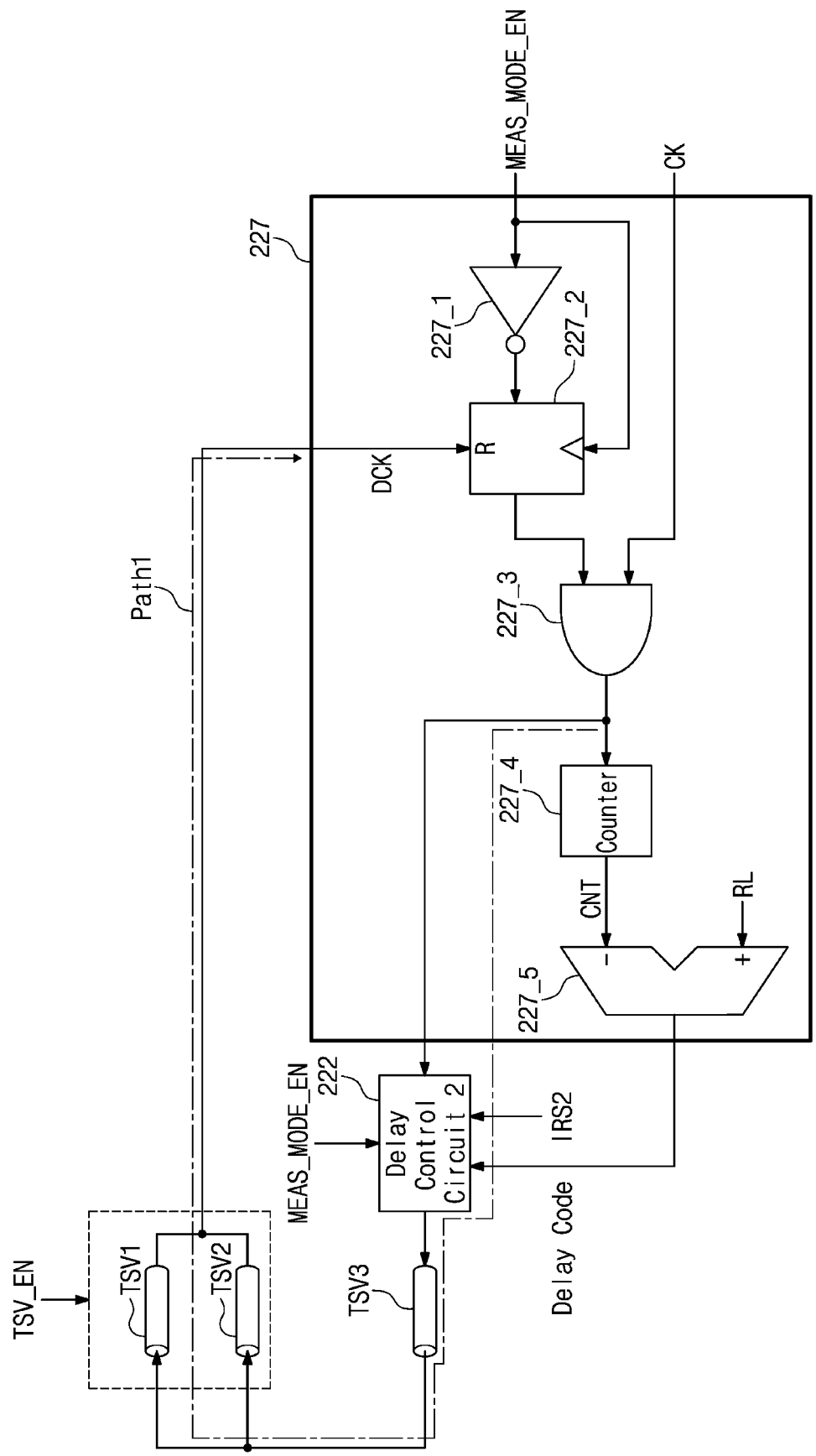
FIG. 5 is a block diagram illustrating a calibration unit of FIG. 2 or 3 according to an embodiment of the inventive concept.

FIG. 5 is a block diagram illustrating a calibration unit of FIG. 2 or 3 according to an embodiment of the inventive concept. FIG. 5 will be described with reference to FIGS. 2 and 3. The calibration unit 227 (or, 127) may include an inverter 227_1, a flip-flop 227_2, an AND gate 227_3, a counter 227_4, and a subtractor 227_5.

The inverter 227_1 may invert a measurement mode enable signal MEAS_MODE_EN indicating a measurement mode being a test mode of the memory device 200. For example, the measurement mode enable signal MEAS_MODE_EN may be activated when the memory device 100 or 200 powers up. The flip-flop 227_2 may output logic "1", for example, when the measurement mode enable signal MEAS_MODE_EN is activated. When receiving a delay clock signal DCK, which a clock signal CK is delayed, through a reset terminal, the flip-flop 227_1 may reset an output. For example, the flip-flop 227_2 may be reset to logic "0" when the delay clock signal DCK has a logic "1". Depending on a logical value of the output of the flip-flop 227_2, the AND gate 227_3 may output the clock signal CK or may not output the clock signal CK. When the measurement mode enable signal MEAS_MODE_EN is activated in the measurement mode, the AND gate 227_3 may provide the clock signal CK to the counter 227_4 and constitute the first path. The first path of FIG. 5 is identical to the first path of FIG. 2.

In an embodiment, the clock signal CK may be input to the buffer die 220 from an outside of the buffer die 220 (e.g., the SoC 13). The clock signal CK may be input to the buffer die 220 from the outside in synchronization with any signal (e.g., a CKE signal indicating a clock enable) input to the buffer die 220 in compliance with the JEDEC standard. In some examples, the clock signal CK may be generated by the second command decoder 221 which decodes a command, which indicates a measurement mode, such as a mode register set (MRS) command. In some examples, the clock signal CK may be generated within the buffer die 220 when the measurement mode enable signal MEAS_MODE_EN is activated. The clock signal CK may have the same period as an external clock signal input to a memory device 200. The clock signal CK may be a pulse signal, the logical state of which is changed.

In an embodiment, in FIG. 5, the numbers of inverters, the number of flip-flops, the number of AND gates, a logic state of an output of the flip-flop 227_2, a phase of an output of the AND gate 227_3, etc. are only exemplary. The calibration unit 227 may further include any other logic gates which perform any other operations (e.g., NAND, NOR, OR, XOR, and XNOR operations), in addition to logic gates illustrated in FIG. 5.

The counter 227_4 may count an interval from a time when the clock signal CK is received to a time when the delay clock signal DCK transmitted through the first path is received. When receiving the clock signal CK, the counter 227_4 may start a counting operation. When the flip-flop 227_2 is reset by the delay clock signal DCK, the counter 227_4 may stop the counting operation. For example, the counter 227_4 may count a delay of the clock signal CK transmitted through the first path.

Referring to FIG. 5, the second delay control circuit 222, the third through silicon via, and one of the first and second through silicon vias may be included in the first path, but components, which are included in the first path, of the buffer die 220 and the first memory die 210 are not limited to this disclosure. For example, the second control signal CTRL2 may be transmitted to the first through silicon via through one or more switches when the first path includes the first through silicon via. When the measurement mode enable signal MEAS_MODE_EN is activated, the second delay control circuit 222 may not delay the clock signal CK based on the delay code described with reference to FIG. 2.

In detail, when the measurement mode enable signal MEAS_MODE_EN is not activated, the second delay control circuit 222 may receive the second internal read signal IRS2 and may delay the second internal read signal IRS2 depending on the delay code as much as a multiple of a clock. When the measurement mode enable signal MEAS_MODE_EN is activated, the second delay control circuit 222 may receive the clock signal CK and may not delay the clock signal CK regardless of the delay code.

In an embodiment, the first path may include any one of the first and second through silicon vias. The calibration unit 227 may select one of the first and second through silicon vias by using a through silicon via (TSV) enable signal TSV EN. The clock signal CK may pass through the first through silicon via through which data are transmitted, or may pass through the second through silicon via through which the second control signal CTRL2 for sampling data is transmitted. As described above, since a path of transmitting data and a path of transmitting the second control signal CTRL2 are identically implemented for the uniform capture margin, even though the clock signal CK passes through any one of the first and second through silicon vias, a delay amount of the delay clock signal DCK may be identically maintained.

The subtractor 227_5 may calculate the delay code of FIGS. 2 and 3 by subtracting a counting value of the counter 227_4 from a value RL indicating a read latency in advance determined. The value RL indicating the read latency in advance determined may be a value obtained by dividing the read latency by one period of a clock and may be in advance stored in the buffer die 220. The delay code which is an output of the subtractor 227_5 may correspond to the depth of the first FIFO units 116 and 216, and the counting value of the counter 227_4 may correspond to the depth of the second FIFO units 126 and 226.

In an embodiment, a value of the delay code may be set to a value which is obtained by subtracting the counting value of the counter 227_4 from the value RL indicating the read latency in advance determined. In another embodiment, the value of the delay code may be set to at least one of values in advance stored in a fuse array, regardless of the counting value. The fuse array may be implemented with various nonvolatile memories such as an electrically programmable fuse, a laser programmable fuse, an anti-fuse, and a flash memory. That is, the value of the delay code may be set based on the counting value, or may be set to a value determined in advance.

Figure 6:
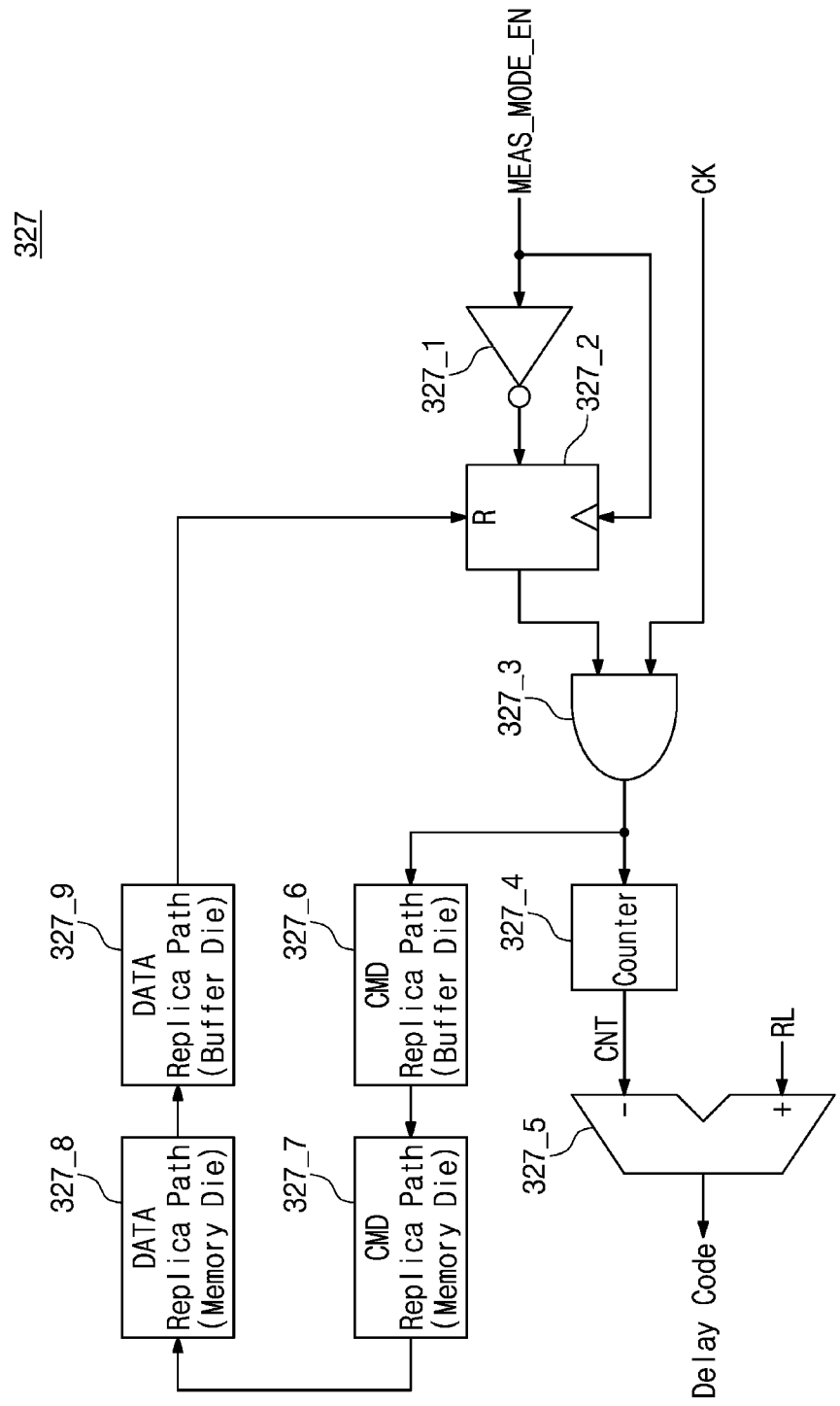
FIG. 6 is a block diagram illustrating a calibration unit of FIG. 2 or 3 according to another embodiment of the inventive concept.

FIG. 6 is a block diagram illustrating a calibration unit of FIG. 2 or 3 according to another embodiment of the inventive concept. FIG. 6 will be described with reference to FIGS. 2, 3, and 5. A calibration unit 327 may include an inverter 327_1, a flip-flop 327_2, an AND gate 327_3, a counter 327_4, and a subtractor 327_5. Operations of components in the calibration unit 327 of FIG. 6 may be identical to operations of the components in the calibration unit 227 of FIG. 5, which have similar reference numerals.

Compared with the calibration unit 227 of FIG. 5, the calibration unit 327 may further include command replica paths 327_6 and 327_7 and data replica paths 327_8 and 327_9. The command replica paths 327_6 and 327_7 and the data replica paths 327_8 and 327_9 are circuits obtained by identically modeling the first path of FIGS. 2 and 5.

In detail, the command replica path 327_6 may be obtained by modeling a path through which a signal generated by the buffer die 120 depending on the read command is transmitted to the first memory die 110. The command replica path 327_7 may be obtained by modeling a path through which a signal transmitted from the buffer die 120 depending on the read command is transmitted to the first FIFO unit 116. The data replica path 327_8 may be obtained by modeling a path through which data of the first FIFO unit 116 are transmitted to the buffer die 120. The data replica path 327_9 may be obtained by modeling a path through which data transmitted from the first FIFO unit 116 are transmitted to the second FIFO unit 126. For example, the calibration unit 327 may directly transmit the clock signal CK to the first path, or may transmit the clock signal CK to a modeling circuit of the first path.

Figure 7:
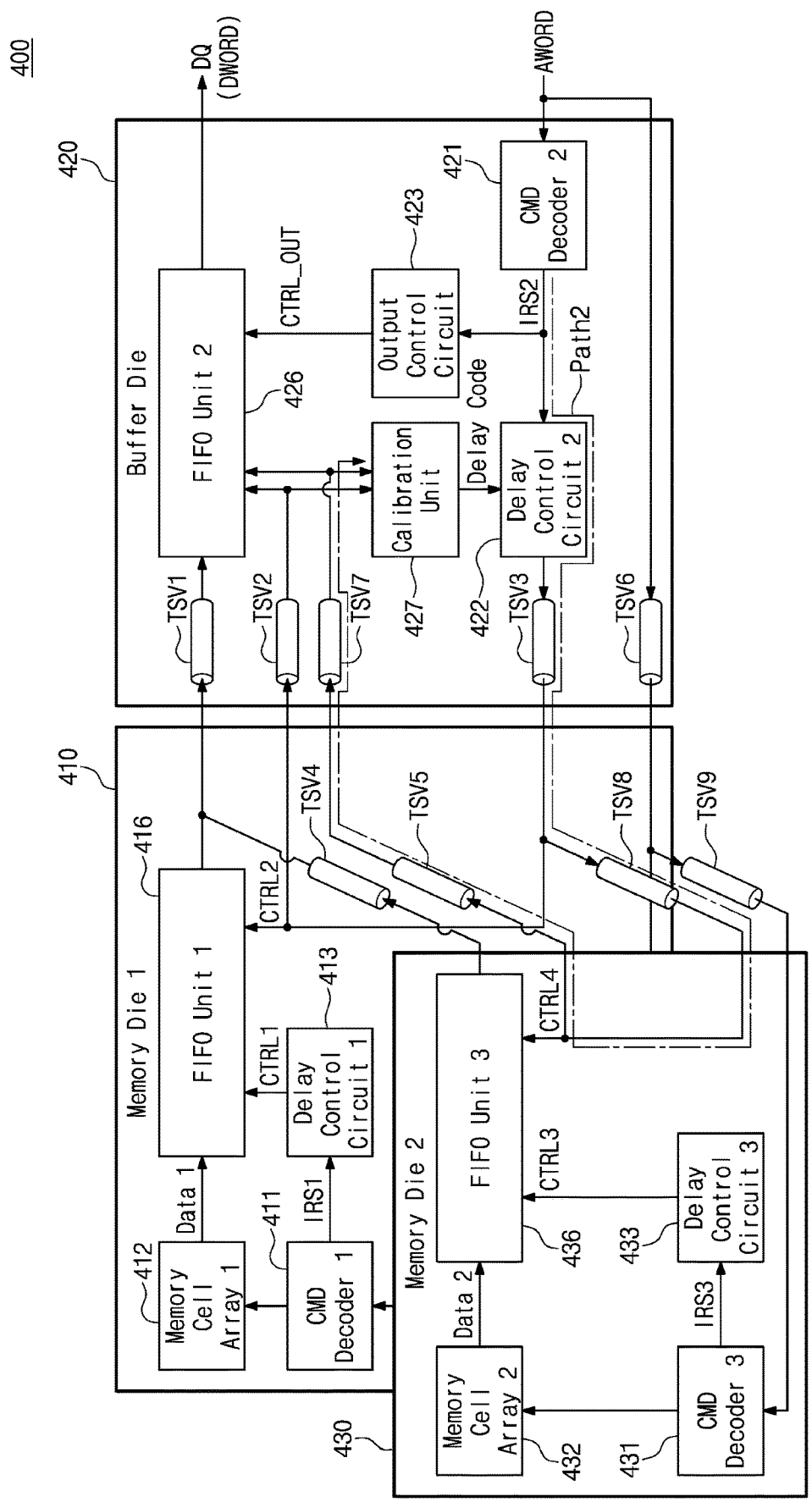
FIG. 7 is a block diagram illustrating a buffer die, a first memory die, and a second memory die of a memory device of FIG. 1 according to example embodiments.

FIG. 7 is a block diagram illustrating a buffer die, a first memory die, and a second memory die of a memory device of FIG. 1 according to example embodiments. A memory device 400 may include a first memory die 410, a second memory die 430, and a buffer die 420. The memory device 400 may be the memory device 11 of FIG. 1, the first memory die 410 may be the first memory die 11_1 of FIG. 1, the second memory die 430 may be the second memory die 11_2 of FIG. 1, and the buffer die 420 may be the buffer die 11_9 of FIG. 1. The first memory die 410 may include a first command decoder 411, a first memory cell array 412, a first delay control circuit 413, and a first FIFO unit 416. The second memory die 430 may be implemented substantially identically to the first memory die 410. The second memory die 430 may include a third command decoder 431, a second memory cell array 432, a third delay control circuit 433, and a third FIFO unit 436. Operations of components in the first and second memory dies 410 and 430 may be identical to operations of the components in the first memory die 110 of FIG. 2, which have similar reference numerals.

The buffer die 420 may include a second command decoder 421, a second delay control circuit 422, an output control circuit 423, a second FIFO unit 426, and a calibration unit 427. Operations of components in the buffer die 420 may be identical to operations of the components in the buffer die 120 of FIG. 2, which have similar reference numerals.

The second memory die 430 may be stacked on the first memory die 410. The second memory die 430 may be any one of the second to eighth memory dies 11_2 to 11_8 of FIG. 1. The first memory die 410 may receive addresses from the buffer die 420 through the sixth through silicon via. The second memory die 430 may receive the same addresses as addresses which the first memory die 410 receives through the sixth through silicon via and at least one ninth through silicon via from the buffer die 420. For example, the first memory die 410 and the second memory die 430 may support the same channel. In this case, the second memory die 430 may be the fifth memory die 11_5 of FIG. 1.

The third command decoder 431 may decode a read command transmitted from the buffer die 420. The second memory cell array 432 may output second data under control of the third command decoder 431 (i.e., in response to the read command). The third delay control circuit 433 may generate a third control signal CTRL3, based on a third internal read signal IRS3 of the third command decoder 431.

The third FIFO unit 436 may sample the second data, based on the third control signal CTRL3. The third FIFO unit 436 may output the sampled data, based on a fourth control signal CTRL4 transmitted from the buffer die 420 through the third through silicon via and at least one eighth through silicon via. The sampled data may be transmitted to the second FIFO unit 426 of the buffer die 420 through at least one fourth through silicon via TSV4 and the first through silicon via. For example, the first and second memory dies 410 and 430 constituting (or supporting) the same channel may share the first through silicon via for a data output. The fourth control signal CTRL4 may be transmitted to the second FIFO unit 426 of the buffer die 420 through at least one fifth through silicon via TSV5 and a seventh through silicon via TSV7.

In an embodiment, for a communication between the second memory die 430 and the buffer die 420, through silicon vias may be interposed between the second memory die 430 and the buffer die 420. Also, the number of the at least one fourth through silicon via, the number of the at least one fifth through silicon via, the number of the at least one eighth through silicon via TSV8, and the number of the at least one ninth through silicon via TSV9 may be determined depending on the number of memory dies stacked between the buffer die 420 and the second memory die 430.

The second FIFO unit 426 of the buffer die 420 may sample first data of the first FIFO unit 416, based on the second control signal CTRL2 transmitted through the second through silicon via. The second FIFO unit 426 may sample the second data transmitted from the third FIFO unit 436 through the at least one fourth through silicon via and the first through silicon via, based on the fourth control signal CTRL4 transmitted from the second memory die 430 through the at least one fifth through silicon via and the seventh through silicon via.

The calibration unit 427 may receive the second control signal CTRL2 passing through the first path (not illustrated) (refer to FIG. 1) and may receive the fourth control signal CTRL4 passing through a second path Path2 (illustrated by an alternated long and short dash line) from the buffer die 420 to the third FIFO unit 436 and from the third FIFO unit 436 to the second FIFO unit 426. Similar to the first path of FIG. 5, the second path may further include the at least one eighth through silicon via and any one of the at least one fourth through silicon via and the at least one fifth through silicon via as the second memory die 430 is stacked on the first memory die 410, and may be longer than the first path.

The calibration unit 427 may generate a delay code based on a further delayed signal of the second and fourth control signals CTRL2 and CTRL4. Since the calibration unit 427 uses the further delayed signal of the second and fourth control signals CTRL2 and CTRL4, a time point when the first data are output from the first memory die 410 and a time point when the second data are output from the second memory die 430 may be identically set. Although not illustrated in FIG. 7, in the case where more memory dies are stacked on the buffer die 420 compared with this disclosure, the calibration unit 427 may generate a delay code based on the latest delayed signal of respective control signals of the stacked memory dies.

The second delay control circuit 422 may generate the second control signal CTRL2, based on the read command and the delay code. The second control signal CTRL2 may be transmitted to the first memory die 410 through the third through silicon via, and may be transmitted to the second memory die 430 through the third through silicon via and the at least one eighth through silicon via. For example, the fourth control signal CTRL4 may be identical to the second control signal CTRL2.

In example embodiments, each of the fourth, fifth, eighth and ninth through silicon vias of FIG. 7 may penetrate the first memory die 410 or the second memory die 430.

Figure 8:
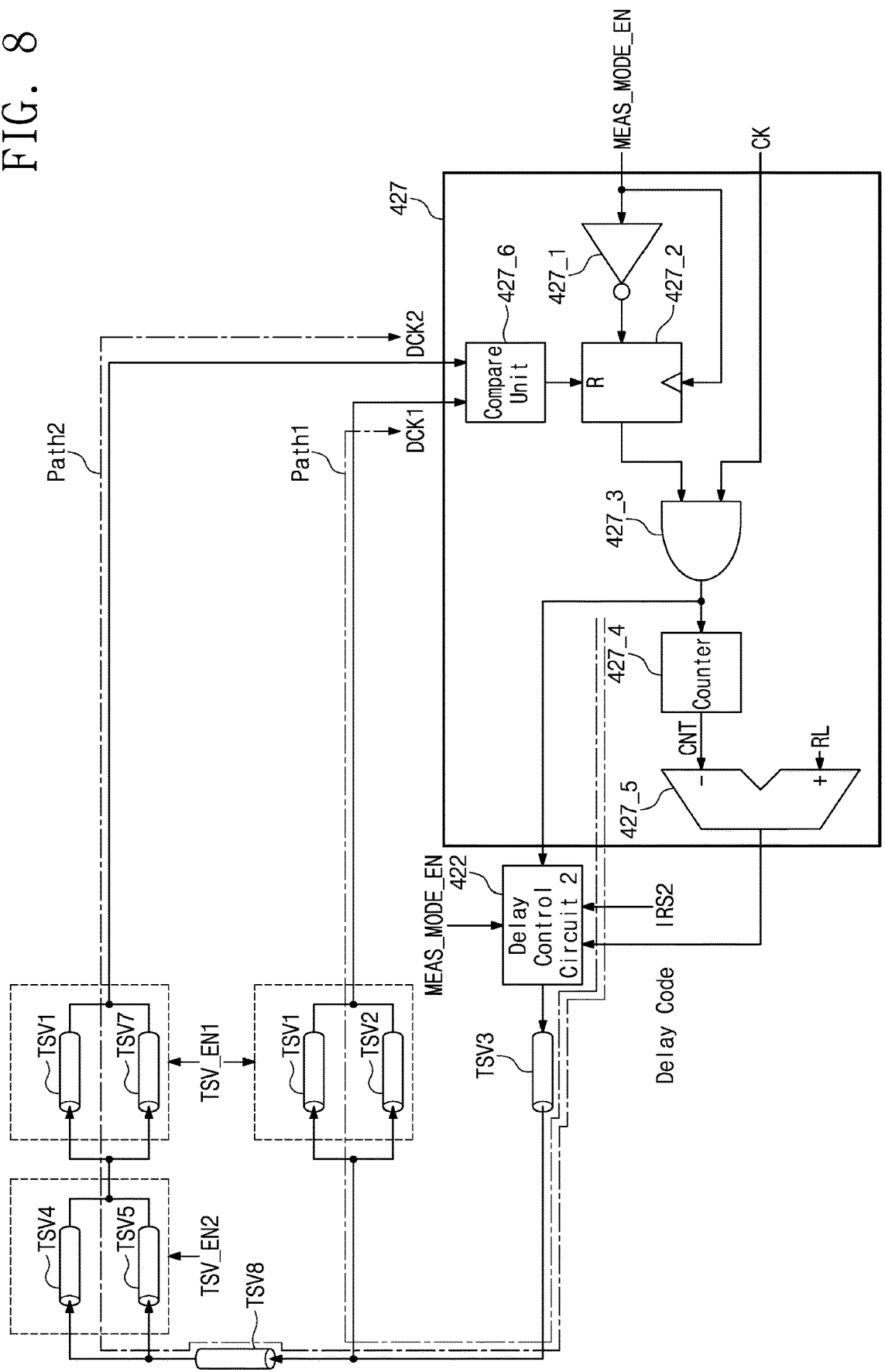
FIG. 8 is a block diagram illustrating a calibration unit of FIG. 7 according to example embodiments.

FIG. 8 is a block diagram illustrating a calibration unit of FIG. 7 according to example embodiments. Referring to FIG. 8, the calibration unit 427 may include an inverter 427_1, a flip-flop 427_2, an AND gate 427_3, a counter 427_4, and a subtractor 427_5. Operations of components in the calibration unit 427 may be identical to operations of the components in the calibration units 227 and 327 of FIGS. 5 and 6, which have similar reference numerals.

The calibration unit 427 may further include a compare unit 427_6. The compare unit 427_6 may provide the flip-flop 427_2 with a further delayed signal of a first delay clock signal DCK1 passing through the first path and a second delay clock signal DCK2 passing through the second path. The compare unit 427_6 may include an OR gate which performs an OR operation on the first delay clock signal DCK1 and the second delay clock signal DCK2. The counter 427_4 may count an interval from a time when the clock signal CK is received to a time when the flip-flop 427_2 receives a further delayed signal of the first and second delay clock signals DCK1 and DCK2.

Referring to FIG. 8, the first path may include the second delay control circuit 422, the third through silicon via, and any one of the first through silicon via and the second through silicon via, and may be identical to the first path of FIGS. 2 and 5. The memory device 400 may select one of the first and second through silicon vias by using a first through silicon via (TSV) enable signal TSV_EN1. The second path may include the second delay control circuit 422, the third through silicon via, the eighth through silicon via and either the fourth through silicon via and the first through silicon via or the fifth through silicon via and the seventh through silicon via, and may be identical to the second path of FIG. 7. The memory device 400 may select a path of either the fourth through silicon via and the first through silicon via or the fifth through silicon via and the seventh through silicon via by using a second TSV enable signal TSV_EN2. Although not illustrated in FIG. 8, as in FIG. 6, the calibration unit 427 may include circuits obtained by modeling the first path and the second path.

In example embodiments, the calibration unit 427 may receive first to nth delay clock signals DCK1 to DCKn when the memory device 400 includes n memory dies. Here, n is a natural number greater than 2.

Figure 9:
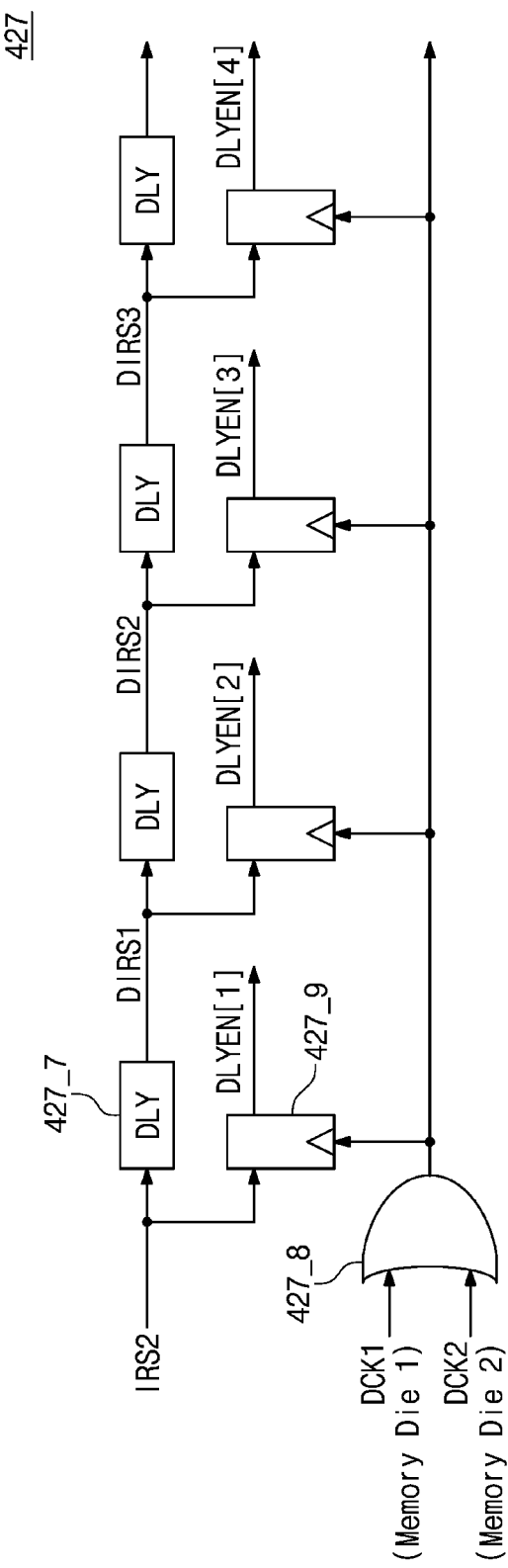
FIG. 9 is a block diagram illustrating a calibration unit of FIG. 7 according to example embodiments.

FIG. 9 is a block diagram illustrating a calibration unit of FIG. 7. FIG. 9 will be described with reference to FIG. 8 according to example embodiments. The calibration unit 427 may further include delay circuits 427_7, an OR gate 427_8, and flip-flops 427_9, in addition to the components of FIG. 8.

The calibration unit 427 may include the serially connected delay circuits 427_7. The delay circuits 427_7 may delay the internal read signal IRS2 of FIG. 7 and may output delay internal read signals DIRS1 to DIRS3. The OR gate 427_8 may provide the flip-flops 427_9 with a further delayed clock signal of the first delay clock signal DCK1 and the second delay clock signal DCK2. The flip-flops 427_9 may compare the further delayed clock signal of the first delay clock signal DCK1 and the second delay clock signal DCK2 with the delay internal read signals DIRS1 to DIRS3 and may output a delay enable code DLYEN[1:4].

The calibration unit 427 may determine whether to calculate the delay code of FIG. 8 by using the counting value based on the delay enable code DLYEN[1:4] or whether to determine the delay code of FIG. 8 as at least one of values in advance stored in a fuse array. For example, in the case where the further delayed clock signal of the first delay clock signal DCK1 and the second delay clock signal DCK2 is prior to the delay internal read signals DIRS1 to DIRS3, the calibration unit 427 may calibrate the delay code of FIG. 8 as at least one of the values in advance stored in the fuse array. The numbers of the delay circuits 427_7 and the flip-flops 427_9 are not limited to illustration of FIG. 9.

Figure 10:
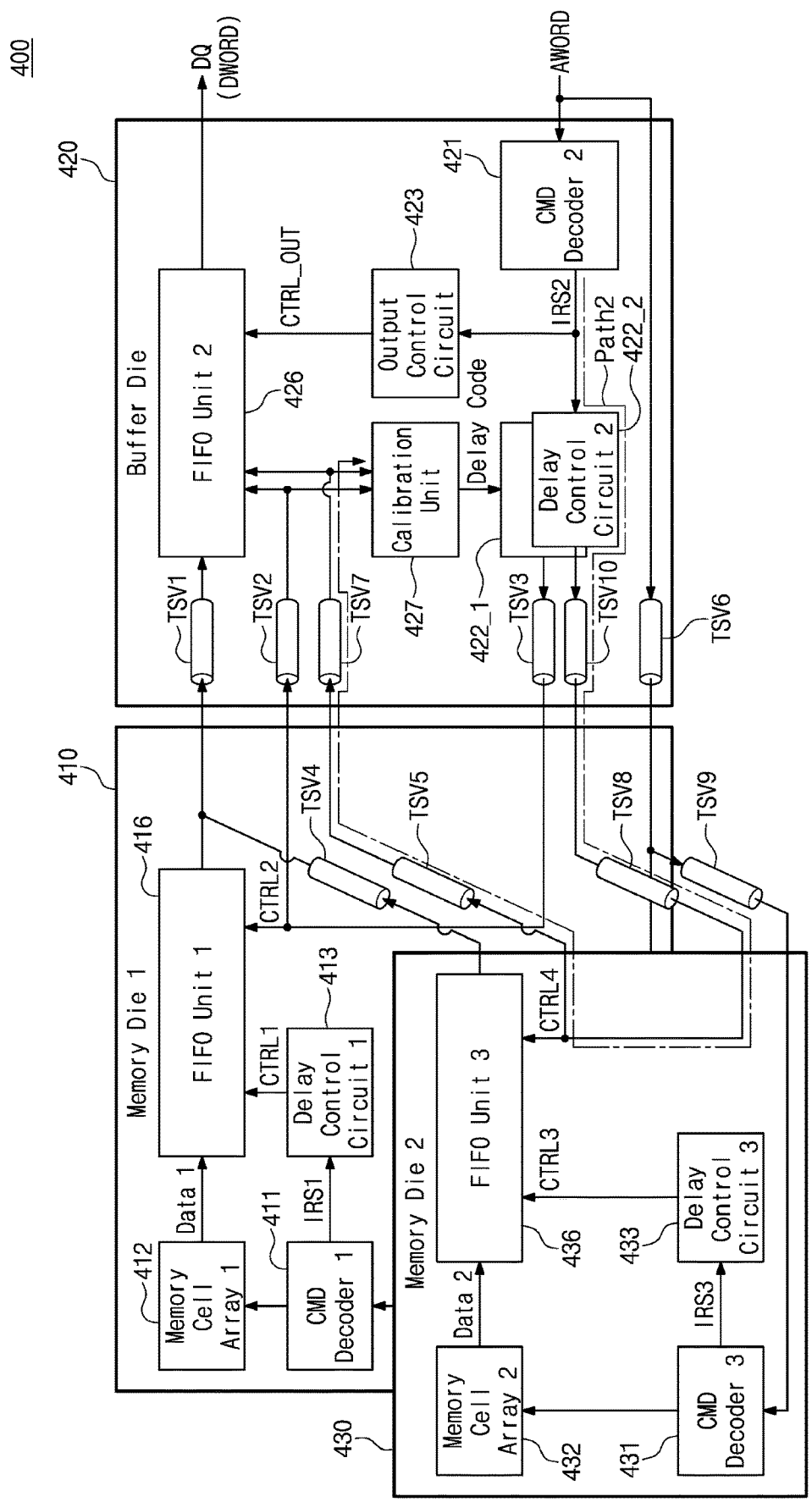
FIG. 10 is a block diagram illustrating a buffer die, a first memory die, and a second memory die of a memory device of FIG. 1 according to example embodiments.

FIG. 10 is a block diagram illustrating a buffer die, a first memory die, and a second memory die of a memory device of FIG. 1 according to example embodiments. A memory device 400 may include a first memory die 410, a second memory die 430, and a buffer die 420. The first memory die 410 and the second memory die 430 of FIG. 10 may be identical to the first memory die 410 and the second memory die 430 of FIG. 7.

The buffer die 420 of FIG. 10 may further include second delay control circuits 422_1 and 422_2 compared with the buffer die 420 of FIG. 7. Each of the second delay control circuits 422_1 and 422_2 may be implemented identically to the second delay control circuit 422 of FIG. 7.

The second delay control circuit 422_1 may generate the second control signal CTRL2 to be transmitted to the first memory die 410 through the third through silicon via, based on the read command and the delay code. The second delay control circuit 422_2 may generate the fourth control signal CTRL4 to be transmitted to the second memory die 430 through a tenth through silicon via TSV10 and the at least one eighth through silicon via, based on the read command and the delay code. For example, the second control signal CTRL2 and the fourth control signal CTRL4 may be respectively generated by independent delay control circuits and may be respectively transmitted through independent paths.

Figure 11:
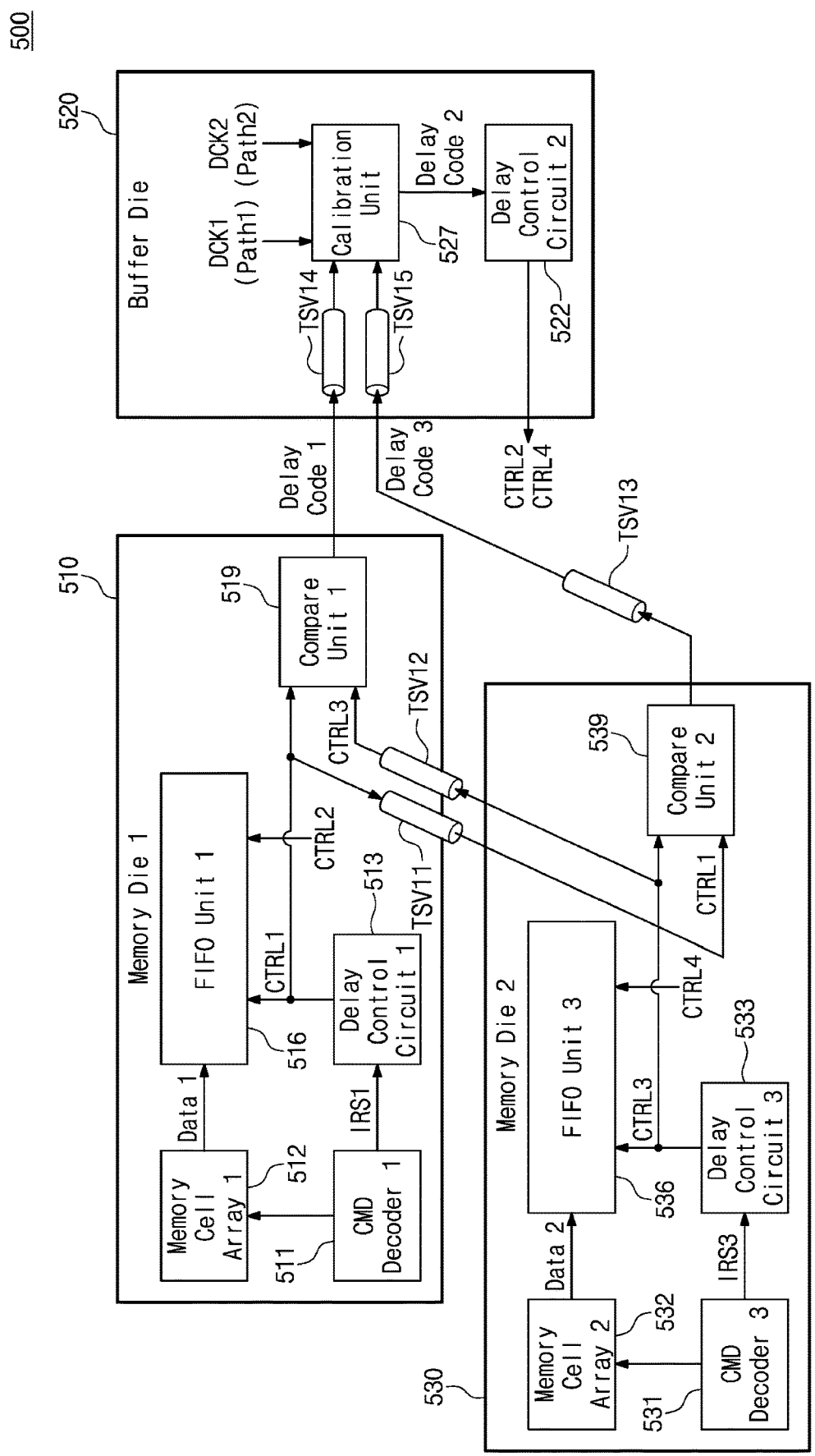
FIG. 11 is a block diagram illustrating a buffer die, a first memory die, and a second memory die of a memory device of FIG. 1 according to example embodiments.

FIG. 11 is a block diagram illustrating a buffer die, a first memory die, and a second memory die of a memory device of FIG. 1 according to example embodiments. A memory device 500 may include a first memory die 510, a second memory die 530, and a buffer die 520. The memory device 500 may be the memory device 11 of FIG. 1, the first memory die 510 may be the first memory die 11_1 of FIG. 1, the second memory die 530 may be the second memory die 11_2 of FIG. 1, and the buffer die 520 may be the buffer die 11_9 of FIG. 1. The first memory die 510 may include a first command decoder 511, a first memory cell array 512, a first delay control circuit 513, a first FIFO unit 516, and a first compare unit 519. Operations of components in the first memory die 510 may be identical to operations of the components in the first memory die 410 of FIG. 7, which have similar reference numerals. The second memory die 530 may include a third command decoder 531, a second memory cell array 532, a third delay control circuit 533, a third FIFO unit 536, and a second compare unit 539. Operations of components in the second memory die 530 may be identical to operations of the components in the second memory die 430 of FIG. 7, which have similar reference numerals. For brevity of drawing, illustration of through silicon vias between the first FIFO unit 516, the third FIFO unit 536, and a buffer die 520 are skipped.

The first compare unit 519 may determine a further delayed control signal of the first control signal CTRL1 and the third control signal CTRL3 transmitted from the second memory die 530 through at least one twelfth through silicon via and may generate a first delay code by counting the further delayed control signal. The second compare unit 539 may determine a further delayed control signal of the third control signal CTRL3 and the first control signal CTRL1 transmitted from the first memory die 510 through at least one eleventh through silicon via TSV11 and may generate a third delay code by counting the further delayed control signal. Each of the first compare unit 519 and the second compare unit 539 may include an OR gate which performs an OR operation on the first control signal CTRL1 and the third control signal CTRL3. The first and second memory dies 510 and 530 may share the first control signal CTRL1 and the third control signal CTRL3 through the at least one eleventh through silicon via and the at least one twelfth through silicon via TSV12.

A time difference may be present between the first control signal CTRL1 and the third control signal CTRL3 due to the PVT variation between the first memory die 510 and the second memory die 530. Nevertheless, a calibration unit 527 may adjust a time point, at which the first data are output from the first FIFO unit 516, and a time point, at which the second data are output from the third FIFO unit 536, so as to be identical to each other by using the first and third delay codes.

The calibration unit 527 of the buffer die 520 may receive the first delay code through a fourteenth through silicon via TSV14, and may receive the third delay code through at least one thirteenth through silicon via TSV13 and a fifteenth through silicon via TSV15. The calibration unit 527 may generate a second delay code by further using the first and third delay codes, as well as a counting value which is based on a further delayed signal of the first and second delay clock signals DCK1 and DCK2. A second delay control circuit 522 may generate the second and fourth control signals CTRL2 and CTRL4, based on the second delay code.

In example embodiments, each of the eleventh, twelfth, and thirteenth through silicon vias of FIG. 11 may penetrate the first memory die 510 or the second memory die 530.

Figure 12:
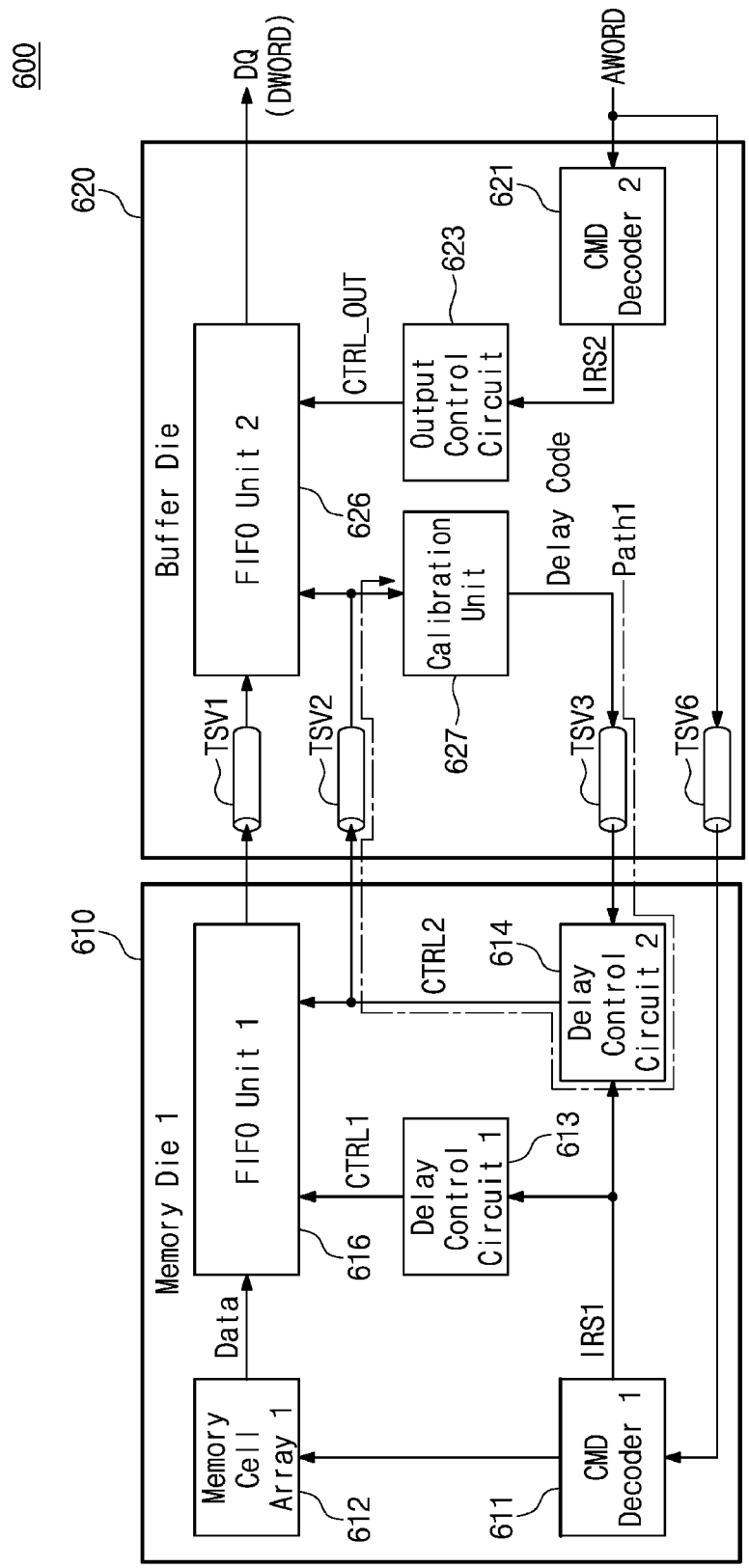
FIG. 12 is a block diagram illustrating a buffer die and a first memory die of a memory device of FIG. 1 according to example embodiments.

FIG. 12 is a block diagram illustrating a buffer die and a first memory die of a memory device of FIG. 1 according to example embodiments. A memory device 600 may include a first memory die 610 and a buffer die 620. The memory device 600 may be the memory device 11 of FIG. 1, the first memory die 610 may be the first memory die 11_1 of FIG. 1, and the buffer die 620 may be the buffer die 11_9 of FIG. 1. The first memory die 610 may include a first command decoder 611, a first memory cell array 612, a first delay control circuit 613, a second delay control circuit 614, and a first FIFO unit 616. Operations of components in the first memory die 610 may be identical to operations of the components in the first memory die 110 of FIG. 2, which have similar reference numerals. The buffer die 620 may include a second command decoder 621, an output control circuit 623, a second FIFO unit 626, and a calibration unit 627. Operations of components in the buffer die 620 may be identical to operations of the components in the buffer die 120 of FIG. 2, which have similar reference numerals.

Returning to FIG. 2, the second delay control circuit 122 which generates the second control signal CTRL2 may be positioned at the buffer die 120. In contrast, referring to FIG. 12, the second delay control circuit 614 which generates the second control signal CTRL2 may be positioned at the first memory die 610. The calibration unit 627 may generate a delay code and may transmit the delay code to the second delay control circuit 614 through the third through silicon via. The second delay control circuit 614 may generate the second control signal CTRL2, based on the first internal read signal IRS1 of the first command decoder 611 and the delay code. As in the first path of FIG. 2, a first path Path1 of FIG. 12 may include the third through silicon via, the second delay control circuit 614, and any one of the first and second through silicon vias.

In example embodiments, the first memory die 610 may further include a first shift register 618_1 and a second shift register 618_2 (not shown). The first and second shift registers 618_1 and 618_2 may respectively shift the first and second control signals CTRL1 and CTRL2 and may generate delayed signals. The first FIFO unit 616 may sequentially sample bits of data output from the first memory cell array 612 by using the delayed signal in which the first control signal CTRL1 is shifted. The first FIFO unit 616 may sequentially output the sampled bits of the data by using the delayed signal in which the second control signal CTRL2 is shifted.

In example embodiments, the buffer die 620 may further include third and fourth shift registers 628_3 and 628_4 (not shown). The third and fourth shift registers 628_3 and 628_4 may shift the second control signal CTRL2, which is transmitted through the second through silicon via, and the output control signal CTRL_OUT, respectively. The third and fourth shift registers 628_3 and 628_4 may generate delayed signals, respectively. The second FIFO unit 626 may sequentially sample bits of data output from the first FIFO unit 616 by using the delayed signal in which the second control signal CTRL2 transmitted through the second through silicon via is shifted. The second FIFO unit 626 may sequentially output the sampled bits of the data by using the delayed signal in which the output control signal CTRL_OUT is shifted.

Figure 13:
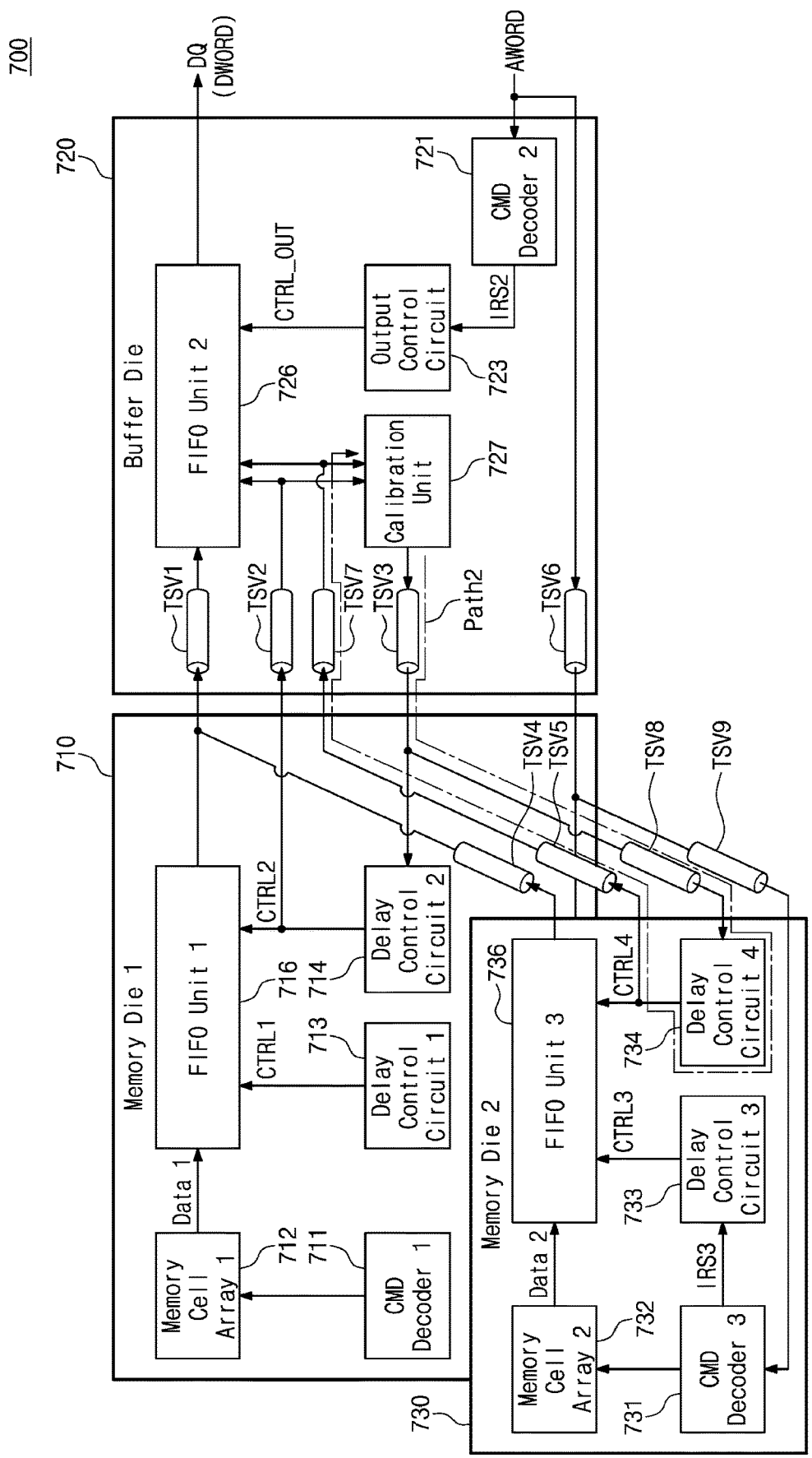
FIG. 13 is a block diagram illustrating a buffer die, a first memory die, and a second memory die of a memory device of FIG. 1 according to example embodiments.

FIG. 13 is a block diagram illustrating a buffer die, a first memory die, and a second memory die of a memory device of FIG. 1 according to example embodiments. A memory device 700 may include a first memory die 710, a second memory die 730 and a buffer die 720. The memory device 700 may be the memory device 11 of FIG. 1, the first memory die 710 may be the first memory die 11_1 of FIG. 1, the second memory die 730 may be the second memory die 11_2 of FIG. 1, and the buffer die 720 may be the buffer die 11_9 of FIG. 1. The first memory die 710 may include a first command decoder 711, a first memory cell array 712, a first delay control circuit 713, a second delay control circuit 714, and a first FIFO unit 716. The second memory die 730 may be implemented substantially identically to the first memory die 710. A second memory die 730 may include a third command decoder 731, a second memory cell array 732, a third delay control circuit 733, a fourth delay control circuit 734, and a third FIFO unit 736. Operations of components in the first and second memory dies 710 and 730 may be identical to operations of the components in the first memory die 610 of FIG. 12, which have similar reference numerals, or to operations of the components in the first and second memory dies 410 and 430 of FIG. 7, which have similar reference numerals.

The buffer die 720 may include a second command decoder 721, an output control circuit 723, a second FIFO unit 726, and a calibration unit 727. Operations of components in the buffer die 720 may be identical to operations of the components in the buffer dies 420 and 620 of FIGS. 7 and 12, which have similar reference numerals.

Referring to FIG. 13, the first memory die 710 may include the second delay control circuit 714 which generates the second control signal CTRL2, and the second memory die 730 may include the fourth delay control circuit 734 which generates the fourth control signal CTRL4. The calibration unit 727 of the buffer die 720 may transmit the delay code to the second delay control circuit 714 through the third through silicon via, and may transmit the delay code to the fourth delay control circuit 734 through the third through silicon via and the at least one eighth through silicon via. As in the second path of FIG. 7, the second path may include the third through silicon via, the at least one eighth through silicon via, the fourth delay control circuit 734, and any one of the at least one fifth through silicon via to the seventh through silicon via and the at least one fourth through silicon via to the first through silicon via.

In example embodiments, each of the fourth, fifth, eighth and ninth through silicon vias of FIG. 13 may penetrate the first memory die 710 or the second memory die 730.

Figure 14:
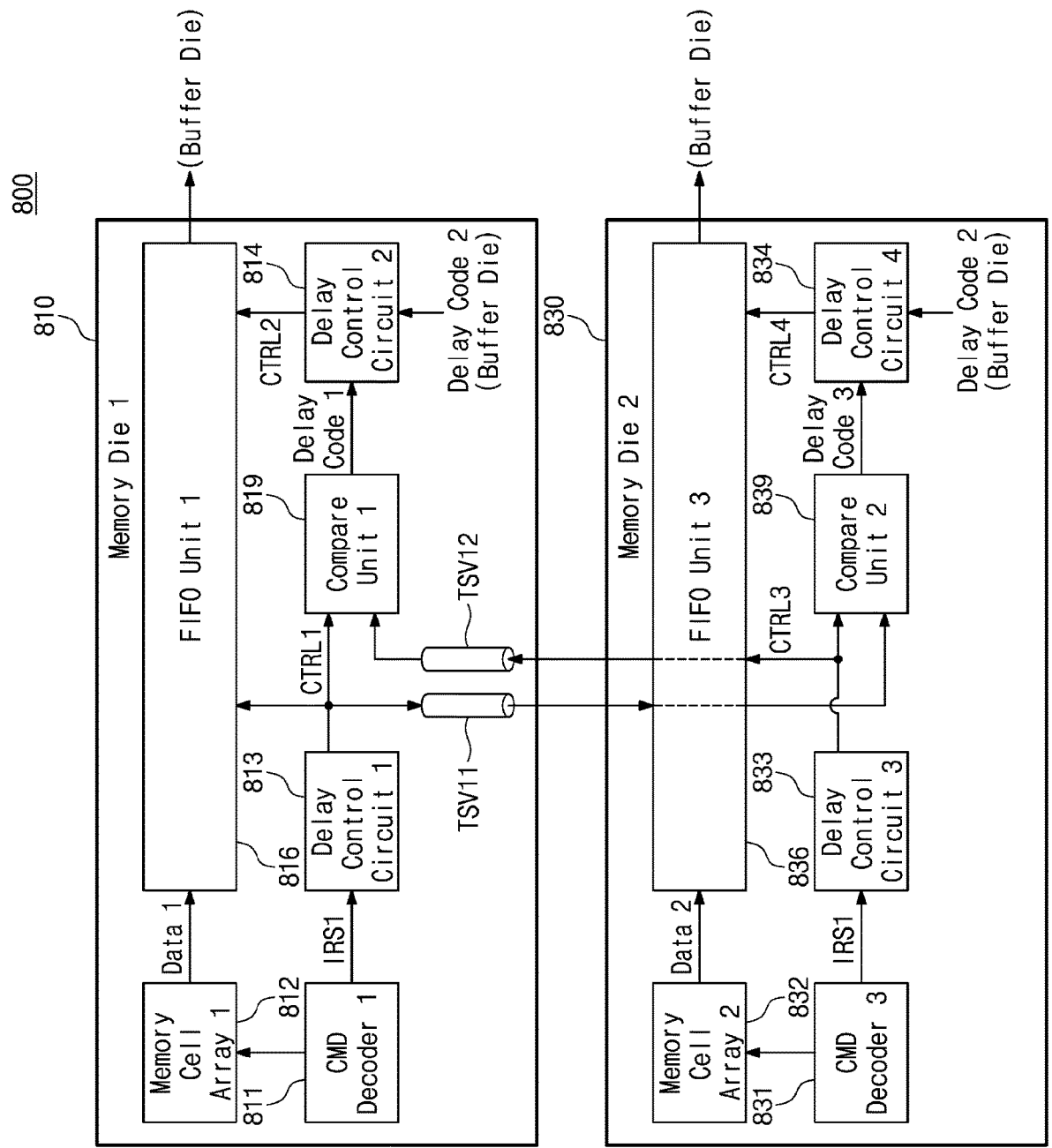
FIG. 14 is a block diagram illustrating first and second memory dies of FIG. 1 according to example embodiments.

FIG. 14 is a block diagram illustrating first and second memory dies of FIG. 1 according to example embodiments. A memory device 800 may include a first memory die 810, a second memory die 830 and a buffer die. The memory device 800 may be the memory device 11 of FIG. 1, the first memory die 810 may be the first memory die 11_1 of FIG. 1, and the second memory die 830 may be the second memory die 11_2 of FIG. 1. In FIG. 14, illustration of the buffer die is skipped. The first memory die 810 may include a first command decoder 811, a first memory cell array 812, a first delay control circuit 813, a second delay control circuit 814, a first FIFO unit 816, and a first compare unit 819. The second memory die 830 may be implemented substantially identically to the first memory die 810. A second memory die 830 may include a third command decoder 831, a second memory cell array 832, a third delay control circuit 833, a fourth delay control circuit 834, a third FIFO unit 836, and a second compare unit 839. Operations of components in the first and second memory dies 810 and 830 may be identical to operations of the components in the memory dies 510, 530, 710, and 730 of FIGS. 11 and 13, which have similar reference numerals.

Since the second and fourth delay control circuits 814 and 834 are respectively positioned at the first and second memory dies 810 and 830, the first compare unit 819 may provide the second delay control circuit 814 with a first delay code without using a through silicon via, and the second compare unit 839 may also provide the fourth delay control circuit 834 with the third delay code without using a through silicon via. The second delay control circuit 814 may generate the second control signal CTRL2 by using the first delay code of the first compare unit 819 and a second delay code of a calibration unit (not illustrated) in the buffer die. The fourth delay control circuit 834 may generate the fourth control signal CTRL4 by using the third delay code of the second compare unit 839 and the second delay code of the calibration unit (not illustrated) in the buffer die.

Figure 15:
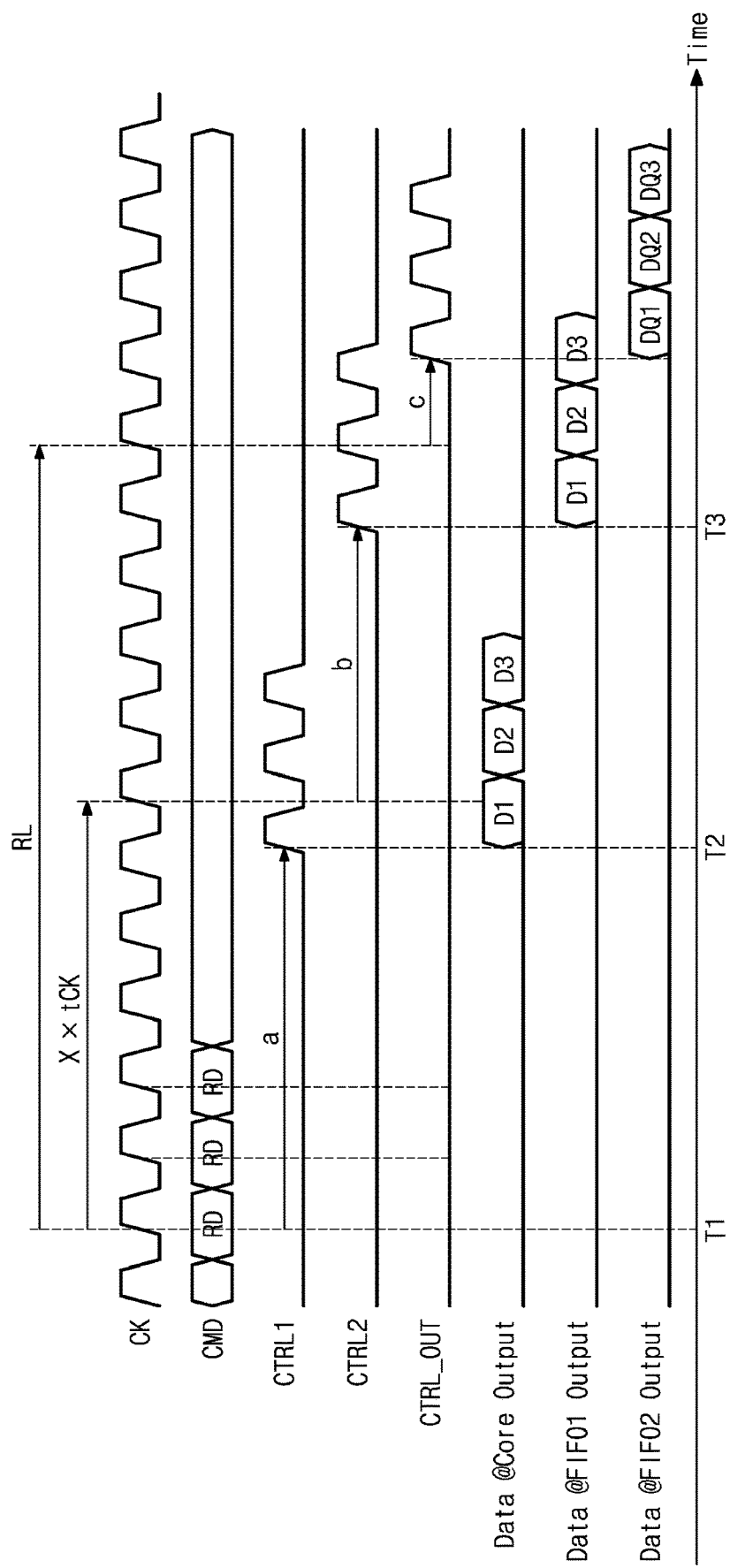
FIG. 15 is a timing diagram illustrating an operation in which data are output from memory devices of FIGS. 2 to 14 according to example embodiments.

FIG. 15 is a timing diagram illustrating an operation in which data are output from memory devices of FIGS. 2 to 14 according to example embodiments. The memory devices 100 to 800 of FIGS. 2 to 14 may operate depending on the timing diagram of FIG. 15. However, for convenience of description, FIG. 15 will be described with reference to FIG. 2.

At a time point T1, the memory device 100 may receive a read command synchronized with the clock signal CK input from an external source such as the SoC 13 in FIG. 1. After the time point T1, the memory device 100 may further receive read commands with intervals of CCD. In FIG. 15, in an embodiment, the CCD interval is illustrated as being "1×tCK", and the CCD is "1". Here, "tCK" indicates a period of the clock signal CK.

At a time point T2, the first delay control circuit 113 of the first memory die 110 may generate the first control signal CTRL1. As an interval between the time points T1 and T2, "a" may indicate an interval from a time point when the read command is input to the memory device 100 to a time point when the first control signal CTRL1 is generated. After the time point T2, data (e.g., D1, D2, and D3) may be output from the first memory cell array 110 (i.e., a core). For example, an interval from a time point when the read command is input to the memory device 100 to a time point when data are output from the first memory cell array 112 may be "X×tCK".

At a time point T3, the second delay control circuit 122 of the buffer die 120 may generate the second control signal CTRL2. An interval from a time point when a time corresponding to "X×tCK" elapses from the time point T1 to a time point when the second control signal CTRL2 is generated may be "b". After the time point T3, data (e.g., D1, D2, and D3) may be output from the first FIFO unit 116.

After the time point T3, the output control circuit 123 may generate the output control signal CTRL_OUT. The second FIFO unit 126 may output the data (e.g., DQ1, DQ2, and DQ3) to the outside as the DQ ("DWORD"). An interval from a time point when a time corresponding to a read latency RL elapses from the time point T1 to a time point when the output control signal CTRL_OUT is generated may be "c". For example, the read latency RL may be in advance defined in compliance with a protocol between a memory device and a SoC, a JEDEC standard, etc.

First, the margin of the first FIFO unit 116 will be described. A data input time point of the first FIFO unit 116 should be prior to a data output time point of the first FIFO unit 116. Accordingly, the following Equation 1 may be established. "$a_{max}$" indicates a maximum interval of "a". "$b_{max}$" indicates a maximum interval of "b".

$$a_{max} < b_{max} + X \times tCK \qquad \text{[Equation 1]}$$

Also, the data output time point of the first FIFO unit 116 should be prior to the data input time point of the first FIFO unit 116 depending on a next read command. Accordingly, the following Equation 2 may be established. "$a_{min}$" indicates a minimum interval of "a". "$b_{min}$" indicates a minimum interval of "b". "n" may indicate the depth of the first FIFO unit 116.

$$b_{min} + X \times tCK < a_{min} + n \times CCD \times tCK \qquad \text{[Equation 2]}$$

Next, the margin of the second FIFO unit 126 will be described. A data input time point of the second FIFO unit 126 should be prior to a data output time point of the second FIFO unit 126. Accordingly, the following Equation 3 may be established. "$c_{max}$" indicates a maximum interval of "c".

$$b_{max} < c_{max} + (RL-X) \times tCK \qquad \text{[Equation 3]}$$

Also, the data output time point of the second FIFO unit 126 should be prior to the data input time point of the second FIFO unit 126 depending on a next read command. Accordingly, the following Equation 4 may be established. "$c_{min}$" indicates a minimum interval of "c" "m" may indicate the depth of the second FIFO unit 126.

$$c_{min} + (RL-X) \times tCK < b_{min} + m \times CCD \times tCK \qquad \text{[Equation 4]}$$

When Equation 1 and Equation 3 are summarized, a condition of "$tCK_{min}$" may be derived as shown in Equation 5. Referring to Equation 5, "$tCK_{min}$", which is a minimum period of a clock of the memory device 100, may be determined based on "X", which indicates a time taken for the first memory cell array 112 to output data in response to the read command.

$$\frac{a_{max} - b_{max}}{X} < tCK, \qquad \text{[Equation 5]}$$

$$\frac{b_{max} - c_{max}}{RL - X} < tCK$$

When Equation 2 and Equation 4 are summarized, a condition of "$tCK_{max}$" may be derived as shown in Equation 6. When "X" which is needed to obtain "$tCK_{min}$" is determined, the depths "n" and "m" of the first and second FIFO units 116 and 126 may be determined without a limitation on "$tCK_{max}$".

$$tCK < \frac{a_{max} - b_{max}}{X - n \times CCD}, \qquad \text{[Equation 6]}$$

$$tCK < \frac{b_{max} - c_{max}}{RL - X - m \times CCD}$$

To remove the limitation on "$tCK_{max}$", "n" indicating the depth of the first FIFO unit 116 should be greater than "X/CCD", and the depth of the second FIFO unit 126 should be greater than "(RL−X)/CCD". When "m" increases, the area of the second FIFO unit 126 may become larger. However, as described above, there is a limitation on the area of the physical layer 12 in the buffer die 11_9 of FIG. 1, in which the second FIFO unit 126 is positioned. Accordingly, according to an embodiment of the inventive concept, "n" and "X" may be adjusted instead of "m". Here, "m" may be fixed to not more than 2. In detail, "X" may vary with "tCK" and a value of "$b_{min}-c_{min}$". For example, as "tCK" decreases and the value of "$b_{min}-c_{min}$" increases, "RL−X" may increase. In contrast, as "tCK" increases and the value of "$b_{min}-c_{min}$" decreases, "RL−X" may decrease.

According to an embodiment of the inventive concept, data and a signal for sampling may be transmitted from a memory die to a buffer die through TSVs. Accordingly, a capture margin between the data and the signal for sampling may be uniformly maintained.

According to another embodiment of the inventive concept, output time points of data output from memory dies may be identically adjusted.

According to another embodiment of the inventive concept, a FIFO unit positioned at the buffer die may be minimized.

While the inventive concept has been described with reference to exemplary embodiments thereof, it will be apparent to those of ordinary skill in the art that various changes and modifications may be made thereto without departing from the spirit and scope of the invention as set forth in the following claims.

What is claimed is:

1. A memory device comprising:
   a buffer die configured to receive a read command; and
   a memory die configured to receive the read command transmitted from the buffer die,
   wherein the memory die includes:
   a memory cell array configured to output data in response to the read command; and a first first-in first-out (FIFO) circuit configured to sample the data output from the memory cell array, and to output the data to the buffer die through a first through silicon via based on a control signal transmitted from the buffer die, and wherein the buffer die includes:
a second FIFO circuit configured to sample the data output from the first FIFO circuit through the first through silicon via, based on the control signal transmitted from the memory die through a second through silicon via;
a calibration circuit configured to generate a delay code, based on a latency of a path from the buffer die to the first FIFO circuit and from the first FIFO circuit to the second FIFO circuit; and
a delay control circuit configured to generate the control signal to be transmitted to the memory die through a third through silicon via, based on the read command and the delay code.

2. The memory device of claim 1, wherein a depth of the second FIFO circuit indicating a number of bits of the data stored in the second FIFO circuit is smaller than a depth of the first FIFO circuit indicating a number of bits of the data stored in the first FIFO circuit.

3. The memory device of claim 2, wherein the calibration circuit is further configured to count the latency of the path including the third through silicon via and including one of the first through silicon via and the second through silicon via.

4. The memory device of claim 2, wherein the calibration circuit includes:
a counter configured to count a delay of a clock signal transmitted through the path in a measurement mode; and
a subtractor configured to calculate the delay code by subtracting a counting value of the counter from a value indicating a predetermined latency,
wherein the delay code corresponds to the depth of the first FIFO circuit and the counting value corresponds to the depth of the second FIFO circuit.

5. The memory device of claim 4, wherein the buffer die further includes:
a command decoder configured to decode the read command and generate an internal read signal, and
wherein the delay control circuit is further configured to generate the control signal by delaying the internal read signal based on the delay code.

6. The memory device of claim 5, wherein the delay control circuit does not delay the clock signal based on the delay code in the measurement mode, and delays the internal read signal based on the delay code when the buffer die receives the read command.

7. The memory device of claim 5, wherein the memory die is a first memory die, the first memory die further including:
a first command decoder configured to decode the read command; and
a first delay control circuit configured to generate a first control signal under control of the first command decoder,
wherein the first FIFO circuit is configured to sample first data, which are the data output from a first memory cell array being the memory cell array, based on the first control signal,
wherein the command decoder of the buffer die is a second command decoder, and wherein the delay control circuit of the buffer die is a second delay control circuit configured to generate a second control signal being the control signal.

8. The memory device of claim 7, further comprising:
a second memory die stacked on the first memory die,
wherein the second memory die includes:
a second memory cell array configured to output second data in response to the read command;
a third command decoder configured to decode the read command;
a third delay control circuit configured to generate a third control signal under control of the third command decoder; and
a third FIFO circuit configured to sample the second data output from the second memory cell array, based on the third control signal and to output the second data to the buffer die through at least one fourth through silicon via and the first through silicon via, based on a fourth control signal transmitted from the buffer die,
wherein the second FIFO circuit of the buffer die is further configured to sample the second data output from the third FIFO circuit through the at least one fourth through silicon via and the first through silicon via, based on the fourth control signal transmitted from the second memory die through at least one fifth through silicon via,
wherein the buffer die generates a first clock, which is the clock signal passing through a first path being the path in the measurement mode, and generates a second clock signal passing through a second path from the buffer die to the third FIFO circuit and from the third FIFO circuit to the second FIFO circuit, and
wherein the calibration circuit is further configured to generate the delay code, based on a further delayed signal of clock signals passing through the first and second paths.

9. The memory device of claim 8, wherein the first memory die further includes:
a first compare circuit configured to count a further delayed control signal of the first and third control signals and generate a first delay code,
wherein the delay code generated by the calibration circuit of the buffer die is a second delay code, and
wherein the second memory die further includes a second compare circuit configured to count a further delayed control signal of the first and third control signals and generate a third delay code.

10. The memory device of claim 9, wherein the calibration circuit is further configured to adjust a first time point, at which the first data are output from the first FIFO circuit of the first memory die, and a second time point, at which the second data are output from the third FIFO circuit of the second memory die, so as to be identical to each other, by using the first and third delay codes.

11. A memory device comprising:
a buffer die configured to receive a read command; and
a memory die configured to receive the read command transmitted from the buffer die,
wherein the memory die includes:
a memory cell array configured to output data in response to the read command;
a delay control circuit configured to generate a control signal, based on the read command and a delay code output from the buffer die; and
a first first-in first-out (FIFO) circuit configured to sample the data output from the memory cell array, and to output the data to the buffer die through a first through silicon via based on the control signal, and wherein the buffer die includes:
- a second FIFO circuit configured to sample the data output from the first FIFO circuit through the first through silicon via, based on the control signal transmitted from the memory die through a second through silicon via; and
- a calibration circuit configured to generate the delay code based on a latency of a path from the buffer die to the first FIFO circuit and from the first FIFO circuit to the second FIFO circuit.

12. The memory device of claim 11, wherein a depth of the second FIFO circuit indicating a number of bits of the data stored in the second FIFO circuit is smaller than a depth of the first FIFO circuit indicating a number of bits of the data stored in the first FIFO circuit.

13. The memory device of claim 12, wherein the memory die is a first memory die, the first memory die further including:
- a first command decoder configured to decode the read command; and
- a first delay control circuit configured to generate a first control signal under control of the first command decoder,
- wherein the delay control circuit of the memory die is a second delay control circuit which generates a second control signal being the control signal,
- wherein the first FIFO circuit is further configured to sample first data, which are the data output from a first memory cell array being the memory cell array, based on the first control signal,
- wherein the buffer die further includes a second command decoder configured to decode the read command,
- wherein the buffer die generates a first clock signal passing through a first path being the path in a measurement mode, and
- wherein the buffer die transmits the delay code to the first memory die through a third through silicon via.

14. The memory device of claim 13, further comprising:
a second memory die stacked on the first memory die, wherein the second memory die includes:
- a second memory cell array configured to output second data in response to the read command;
- a third command decoder configured to decode the read command;
- a third delay control circuit configured to generate a third control signal under control of the third command decoder;
- a fourth delay control circuit configured to generate a fourth control signal, based on the delay code and the read command transmitted from the buffer die; and
- a third FIFO circuit configured to sample the second data output from the second memory cell array, based on the third control signal and to output the second data to the buffer die through at least one fourth through silicon via and the first through silicon via, based on the fourth control signal,
wherein the second FIFO circuit of the buffer die is further configured to sample the second data output from the third FIFO circuit through the at least one fourth through silicon via and the first through silicon via, based on the fourth control signal,
wherein the buffer die further generates a second clock signal passing through a second path from the buffer die to the third FIFO circuit and from the third FIFO circuit to the second FIFO circuit in the measurement mode, and
wherein the calibration circuit generates the delay code, based on a further delayed signal of clock signals passing through the first and second paths.

15. The memory device of claim 14, wherein the first memory die further includes:
- a first compare circuit configured to count a further delayed control signal of the first and third control signals and generate a first delay code,
- wherein the delay code generated by the calibration circuit of the buffer die is a second delay code, and
- wherein the second memory die further includes:
- a second compare circuit configured to count a further delayed control signal of the first and third control signals and generate a third delay code.

16. The memory device of claim 15, wherein the second delay control circuit of the first memory die is further configured to adjust a first time point, at which the first data are output from the first FIFO circuit, by using the first delay code, and
wherein the fourth delay control circuit of the second memory die is further configured to adjust a second time point, at which the second data are output from the third FIFO circuit, by using the third delay code.

17. A memory device comprising:
a buffer die configured to receive a read command; and
a plurality of memory dies configured to receive the read command transmitted from the buffer die,
wherein each of the plurality of memory dies includes:
- a memory cell array configured to output data in response to the read command; and
- a first first-in first-out (FIFO) circuit configured to sample the data output from the memory cell array, and to output the data to the buffer die through at least one first through silicon via based on a control signal, and
wherein the buffer die includes:
- a second FIFO circuit configured to sample the data output from the first FIFO circuit through the at least one first through silicon via, based on the control signal transmitted from each of the plurality of memory dies through at least one second through silicon via; and
- a calibration circuit configured to generate a delay code indicating a delay of the control signal, based on a latency of a path from the buffer die to the first FIFO circuit and from the first FIFO circuit to the second FIFO circuit.

18. The memory device of claim 17, wherein the buffer die generates a plurality of delayed clock signals passing through the path of each of the plurality of memory dies in a measurement mode, and
wherein the calibration circuit is further configured to generate the delay code, based on the latest delayed signal of the plurality of delayed clock signals.

19. The memory device of claim 17, wherein the buffer die further includes:
a delay control circuit configured to generate the control signal transmitted to each of the plurality of memory dies through at least one third through silicon via, based on the read command and the delay code.

20. The memory device of claim 17, wherein the buffer die is configured to transmit the delay code to each of the plurality of memory dies through at least one third through silicon via, and wherein each of the plurality of memory dies further includes a delay control circuit configured to generate the control signal, based on the delay code and the read command transmitted from the buffer die.

* * * * *